(12) United States Patent
Bailey et al.

(10) Patent No.: US 6,959,037 B2
(45) Date of Patent: Oct. 25, 2005

(54) SYSTEM AND METHOD FOR LOCATING AND DETERMINING DISCONTINUITIES AND ESTIMATING LOOP LOSS IN A COMMUNICATIONS MEDIUM USING FREQUENCY DOMAIN CORRELATION

(75) Inventors: George R. Bailey, Gaithersburg, MD (US); Terry Zhou, Germantown, MD (US)

(73) Assignee: Spirent Communications of Rockville, Inc., Rockville, MD (US)

( * ) Notice: Subject to any disclaimer, the term of this patent is extended or adjusted under 35 U.S.C. 154(b) by 93 days.

(21) Appl. No.: 10/661,511

(22) Filed: Sep. 15, 2003

(65) Prior Publication Data

US 2005/0057880 A1 Mar. 17, 2005

(51) Int. Cl.$^7$ .......................... H04B 3/46; G01R 31/08; G01R 31/11
(52) U.S. Cl. .................... 375/224; 324/520; 324/527; 324/533; 379/22.03
(58) Field of Search .................. 324/512, 520, 324/527, 532, 533, 534; 375/224; 379/22.01, 22.03, 22.04

(56) References Cited

U.S. PATENT DOCUMENTS

| | | | |
|---|---|---|---|
| 3,751,606 A | 8/1973 | Kaiser, Jr. ............... | 379/22.03 |
| 3,870,838 A | 3/1975 | Corwin et al. ............ | 375/214 |
| 3,904,839 A | 9/1975 | Peoples .................... | 379/22.03 |
| 3,991,363 A | 11/1976 | Lathrop ..................... | 324/529 |
| 4,039,923 A | 8/1977 | Vukasovic ................. | 363/79 |
| 4,039,938 A | 8/1977 | Link ........................... | 324/521 |
| 4,041,381 A | 8/1977 | Hwa .......................... | 324/533 |
| 4,229,626 A | 10/1980 | Peoples ..................... | 324/605 |
| 4,630,228 A | 12/1986 | Tarczy-Hornock et al. ... | 702/59 |
| 4,812,738 A | 3/1989 | Itaya et al. ................ | 324/638 |
| 4,868,506 A | 9/1989 | DiStefano et al. ......... | 324/521 |
| 4,945,234 A | 7/1990 | Goodman et al. .......... | 250/291 |
| 5,033,019 A | 7/1991 | White ......................... | 708/404 |
| 5,062,414 A | 11/1991 | Grim ........................... | 602/19 |
| 5,068,614 A | 11/1991 | Fields et al. ............... | 324/534 |
| 5,404,388 A | 4/1995 | Eu ............................... | 379/24 |
| 5,465,287 A | 11/1995 | Egozi ......................... | 379/22.02 |
| 5,475,315 A | 12/1995 | Cabot ......................... | 324/628 |
| 5,481,195 A | 1/1996 | Meyer ......................... | 324/534 |
| 5,530,367 A | 6/1996 | Bottman ..................... | 324/616 |
| 5,548,222 A | 8/1996 | Jensen et al. .............. | 324/628 |

(Continued)

OTHER PUBLICATIONS

Paz, Robert A., Simple Computational Methods for Frequency Domain Robustness Measures, Klipsch School of electrical and Computer Engineering, Jun. 5, 2001, pp. 1–13.

*Primary Examiner*—Khai Tran
*Assistant Examiner*—David B. Lugo
(74) *Attorney, Agent, or Firm*—Katten Muchin Rosenman, LLP; Gilberto M. Villacorta; Andrew J. Bateman

(57) ABSTRACT

A system for determining characteristics associated with a communication channel includes a transmitter for transmitting a first signal via the communication channel. The system includes a receiver for receiving a second signal via the communication channel in response to the first signal. The second signal is associated with the first signal. The system includes a correlator for performing frequency domain correlation between a frequency domain representation of the second signal and frequency domain representations of a plurality of time-delayed versions of the first signal to generate frequency domain correlation information. The system includes an analyzer for identifying correlation peaks in a magnitude of the frequency domain correlation information to determine locations of discontinuities of the communication channel. The identified correlation peaks are associated with the locations of the discontinuities of the communication channel.

24 Claims, 15 Drawing Sheets

U.S. PATENT DOCUMENTS

| | | | |
|---|---|---|---|
| 5,565,764 A | 10/1996 | Priebe et al. | 324/76.21 |
| 5,630,208 A | 5/1997 | Enge et al. | 455/65 |
| 5,654,982 A | 8/1997 | Goodson et al. | 375/222 |
| 5,672,974 A | 9/1997 | Turner | 324/621 |
| 5,714,885 A | 2/1998 | Lulham | 324/529 |
| 5,751,149 A | 5/1998 | Oberg et al. | 324/533 |
| 5,818,371 A | 10/1998 | Lu et al. | 341/122 |
| 5,881,130 A | 3/1999 | Zhang | 379/27.08 |
| 5,949,236 A | 9/1999 | Franchville | 324/533 |
| 5,994,905 A | 11/1999 | Franchville | 324/533 |
| 5,995,588 A | 11/1999 | Crick | 379/22 |
| 6,124,717 A | 9/2000 | Guenther, Jr. et al. | 324/642 |
| 6,144,721 A | 11/2000 | Stephens | 379/21 |
| 6,177,801 B1 | 1/2001 | Chong | 324/520 |
| 6,246,729 B1 | 6/2001 | Richardson | 375/324 |
| 6,311,158 B1 | 10/2001 | Larouche | 704/269 |
| 6,347,286 B1 | 2/2002 | Petillon | 702/77 |
| 6,373,923 B1 | 4/2002 | Williamson et al. | 379/22.01 |
| 6,385,297 B2 | 5/2002 | Faulkner et al. | 379/1.04 |
| 6,389,109 B1 | 5/2002 | Schmidt et al. | 379/1.04 |
| 6,417,672 B1 | 7/2002 | Chong | 324/520 |
| 6,466,649 B1 | 10/2002 | Walance et al. | 379/22.03 |
| 6,477,238 B1 | 11/2002 | Schneider et al. | 379/22.04 |
| 6,516,049 B1 | 2/2003 | Heidari et al. | 379/1.01 |
| 6,525,522 B1 | 2/2003 | Pickerd | 324/76.58 |
| 6,525,545 B2 * | 2/2003 | Hill | 324/642 |
| 6,563,867 B2 | 5/2003 | Gazsi | 375/224 |
| 6,574,308 B1 | 6/2003 | MacDonald et al. | 379/1.04 |
| 6,574,311 B1 | 6/2003 | Ross et al. | 379/27.08 |
| 2002/0090059 A1 | 7/2002 | Berrier et al. | 379/22.03 |
| 2002/0181665 A1 | 12/2002 | Belge et al. | 379/27.01 |
| 2003/0020898 A1 | 1/2003 | Wyar | 356/73.1 |
| 2003/0021391 A1 | 1/2003 | Rubin et al. | 379/22.04 |
| 2003/0040875 A1 | 2/2003 | Rao et al. | 702/76 |
| 2003/0040876 A1 | 2/2003 | Rao | 702/76 |

\* cited by examiner

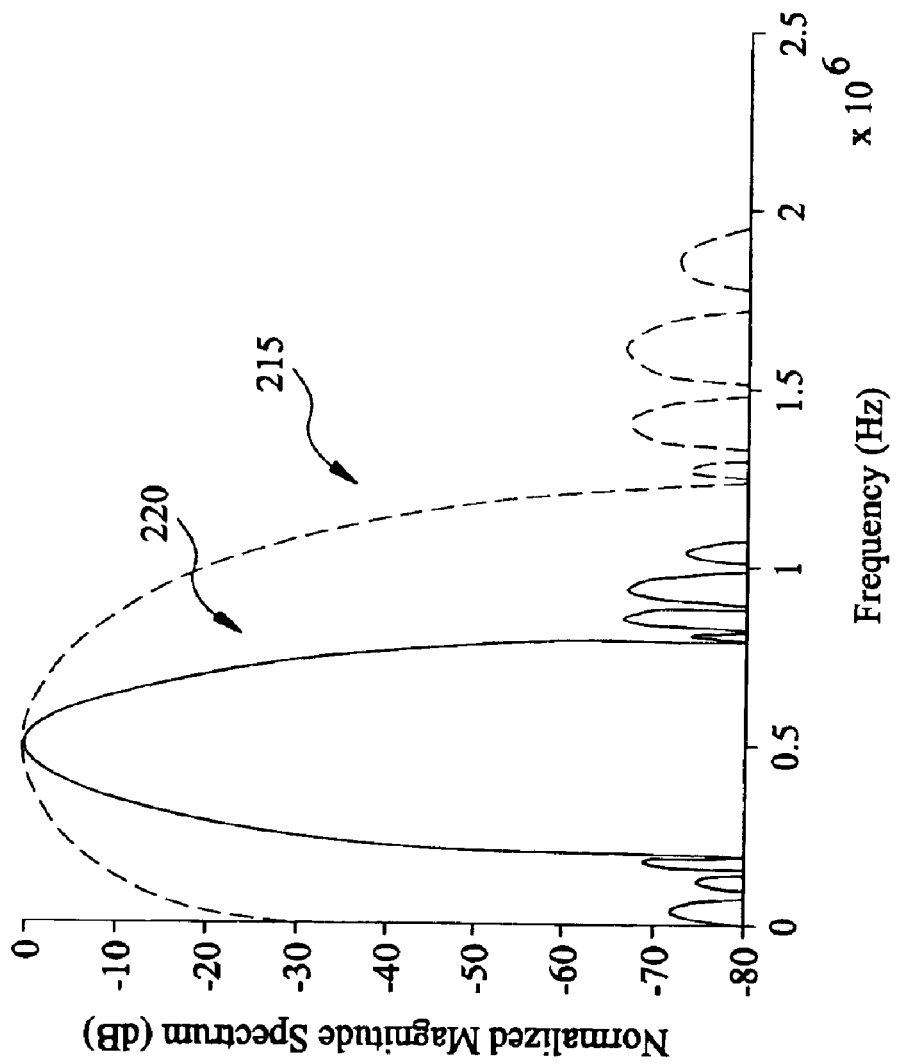

SYSTEM AND METHOD FOR LOCATING AND DETERMINING DISCONTINUITIES AND ESTIMATING LOOP LOSS IN A COMMUNICATIONS MEDIUM USING FREQUENCY DOMAIN CORRELATION

BACKGROUND

1. Field of the Invention

The present invention relates to testing of information communication systems. More particularly, the present invention relates to a system and method for locating and determining discontinuities and estimating loop loss in a communications medium using frequency domain correlation.

2. Background Information

A time domain reflectometer (TDR) operates by abruptly stimulating an object under test, and subsequently, over time, recording the elicited responses. Typically, the subject object is a medium designed for the propagation of energy from point to point in some form, such as, for example, sound, light or electricity. One type of TDR can analyze the electrical propagation characteristics of extended lengths of twisted pairs of wires, as are commonly used to transport telecommunications signals. Such a TDR is designed to interface with twisted pair wire lines that are deployed as a subscriber loop plant (the pair of leads over which each subscriber has traditionally been provided fixed location telephone service) from the service provider's end.

In operation, such a TDR emits a probe signal of an appropriate kind for the subject telecommunications medium. In other words, in the TDR application, the transmitter injects a stimulus into the transmission medium, such as a transmission line. Non-uniformities in the telecommunications medium exist, and probe signal energy is lost progressively as a function of distance traveled in the medium, due to the unavoidable dissipative characteristics of the medium material. Any non-uniformity encountered as the probe signal stimulus propagates along the medium results in at least a partial reversal of probe signal energy flow, thus producing a return or echo signal that propagates back toward the stimulus source. These echoes, or reflections, are essentially returning signatures of aberrations in an otherwise continuous and uniform telecommunications transmission medium. In other words, a reflected and a forward signal are generated in response to a change of the characteristic impedance—a discontinuity—along the transmission line. Additionally, part of the generated forward signal will be reflected back if more discontinuities exist. The TDR records echoes or reflections, if any, from the moment of probe signal emission, as a function of time as the echoes arrive back at the source. Recording these echoes with respect to time provides a signature of the medium that reveals non-uniformities created either intentionally or by accident, along the propagation path. In other words, the reflected signals are received by a receiver and analyzed to impute the transmission line topology. In addition, the distance from the observation point to any particular aberration can be imputed from the corresponding return delay time relative to the probe signal stimulus, if the propagation speed for the medium is known. Thus, a TDR can provide a convenient means of identifying the type of, and distance to, a particular discontinuity or defect.

The probe signal, or stimulus, used for TDR is generally a uni-polar pulse. An example of such a uni-polar stimulus signal can be $pt(t)=0.5*(1-\cos(2\pi f_c t))$, $0 \leq t \leq 2$ $\mu$sec, where $f_c=500$ kHz, although other uni-polar pulses can be used, as well as any center frequency. Using such a stimulus signal, large amounts of DC and low frequency components exist. This can pose a problem for the TDR implementation for twisted-pair and similar dispersive channels. In twisted-pair channels, the higher frequency components will be attenuated more than the lower frequency components. This is referred to as attenuation distortion. Additionally, the higher frequency components will travel faster than the lower frequency components. This is referred to as dispersion. Since a large number of frequency components exist, the overall effect is that the reflected signal becomes smeared out, making it difficult to determine the starting time of the reflection and, hence, the location of the discontinuity. Similarly, since the attenuation of the received signal is comprised of compound effects from components from a large frequency range, especially the low frequency range, it becomes difficult to determine the round-trip loss of the communication channel.

Thus, a uni-polar stimulus can be comprised of a very broad set of frequency components. It is well known that the phase constant is a function of frequency and that different frequency components propagate at different phase velocities in a dispersive transmission line, such as practical twisted-pair subscriber line. The different phase velocities at different frequencies lead to dispersion of signal energy and to inter-symbol interference. In the conventional TDR application, the locations of the discontinuities are obtained by multiplying the one-half of round-trip time to the considered discontinuity with a phase velocity. Since the stimulus is a broadband signal, it is extremely difficult to find a phase velocity that is suitable for all different lengths and structures of transmission lines. For example, a velocity factor of 0.67 of the light speed may be suitable for a short line, while 0.58 or lower may be more appropriate for a long line. The reason for the difficulty is that the extremely high attenuation of the high frequency components for the long line leads to components at lower frequency band dominating the reflected signal.

In conventional TDR implementations, some efforts have been made to address the issues with dispersion. For example, a high-pass filter can be used in the receiver. Use of the high-pass filter can result in the attenuation of frequency components up to a certain frequency (depending on the high-pass filter used). However, generally large amounts of low-pass frequency components will still exist. The dispersion in the twisted-pair channel can then still make localization of a discontinuity difficult. Thus, the attenuation distortion and dispersion can adversely affect the accuracy of traditional TDR measurements.

SUMMARY OF THE INVENTION

A method and system are disclosed for determining characteristics associated with a communication channel. In accordance with exemplary embodiments, according to a first aspect of the present invention, the system can include a transmitter for transmitting a first signal via the communication channel. The system can include a receiver for receiving a second signal via the communication channel in response to the first signal. The second signal can be associated with the first signal. The system can include a correlator for performing frequency domain correlation between a frequency domain representation of the second signal and frequency domain representations of a plurality of time-delayed versions of the first signal to generate frequency domain correlation information. The system can include an analyzer for identifying correlation peaks in a magnitude of the frequency domain correlation information to determine locations of discontinuities of the communication channel. The identified correlation peaks can be associated with the locations of the discontinuities of the communication channel.

According to the first aspect, the communication channel can comprise a transmission line. A discontinuity of the communication channel can comprise one of an open connection in the communication channel, a short in the communication channel, a bridge tap of the communication channel, a change in characteristic impedance of the communication channel, and a discrete lump component. The discrete lump component can include at least one of a resistor, a capacitor and an inductor.

According to the first aspect, the analyzer can identify correlation peaks by determining where magnitudes of the frequency domain correlation information exceed at least one predetermined threshold function. The analyzer can determine a type of a located discontinuity from among a plurality of types of discontinuities by comparing an amplitude of the identified correlation peak with each of a plurality of predetermined threshold functions. Each type of discontinuity can be associated with one of the plurality of predetermined threshold functions. According to the first aspect, the first signal can comprise a stimulus signal. The transmitter can comprise a stimulus generator for generating the stimulus signal. The second signal can comprise at least one reflection of the stimulus signal from at least one discontinuity of the communication channel. The stimulus signal can comprise a narrowband stimulus signal. The narrowband stimulus signal can mitigate effects of dispersion associated with the communication channel. The stimulus generator can adaptively determine a packet length of the narrowband stimulus signal based on attenuation associated with the communication channel. The narrowband stimulus signal can comprise sine packets windowed by, for example, a Blackman-Harris function.

According to the first aspect, the system can include means for generating an estimate of a baseline signal by applying the first signal to a model of the communication channel. The receiver can mitigate baseline effects to the second signal by subtracting the estimated baseline signal from the second signal. The baseline signal can comprise a near-end echo of the first signal associated with transmission of the first signal. The second signal can comprise the near-end echo and reflections of the first signal by discontinuities of the communication channel. According to the first aspect, the correlator can perform a Fourier transform on the second signal to generate the frequency domain representation of the second signal. The correlator can generate the plurality of time-delayed versions of the first signal. The correlator can perform Fourier transforms on the plurality of time-delayed versions of the first signal to generate the frequency domain representations of the plurality of time-delayed versions of the first signal. When at least one attribute of the communication channel is known a priori, a time delay of a first of the plurality of time-delayed versions of the first signal can be greater than zero. The at least one attribute of the communication channel known a priori can comprise, for example, a length of the communication channel in which there is an absence of discontinuities of the communication channel.

According to the first aspect, the analyzer can examine phase information associated with the frequency domain correlation information of the second signal relative to an associated time-delayed version of the first signal to determine a type of a discontinuity of the communication channel. The analyzer can calculate reflection coefficients for each identified correlation peak using at least the determined locations of the discontinuities of the communication channel, and can determine a topology of the communication channel using the reflection coefficients. The phase information can be used for determining a sign of the reflection coefficients.

According to the first aspect, when the phase information is within a predetermined range, the sign of the reflection coefficient associated with the identified correlation peak is positive. When the phase information is outside the predetermined range, the sign of the reflection coefficient associated with the identified correlation peak is negative. When an amplitude of an identified correlation peak exceeds a predetermined threshold function and when the sign of the reflection coefficient associated with the identified correlation peak is positive, the type of discontinuity comprises an open. When an amplitude of an identified correlation peak exceeds a predetermined threshold function and when the sign of the reflection coefficient associated with the identified correlation peak is negative, the type of discontinuity comprises a short. When an amplitude of a first identified correlation peak is less than a first predetermined threshold function and greater than a second predetermined threshold function, and when the sign of the reflection coefficient associated with the first identified correlation peak is negative, the type of discontinuity comprises a bridge tap. A location of the first identified peak can comprise a location of the bridge tap. When an amplitude of a second identified correlation peak is greater than a third predetermined threshold function, and when the sign of the reflection coefficient associated with the second identified correlation peak is positive, a difference between a location of the second identified correlation peak and the location of the first identified peak can comprise a length of the bridge tap.

According to the first aspect, the analyzer can determine round trip loss of the communication channel to the determined location of the discontinuity using an amplitude of the identified correlation peak and an amplitude of a reference correlation peak. The analyzer can determine path loss of the communication channel to the determined location of the discontinuity using the determined round trip loss and at least one characteristic of a type of the discontinuity.

According to a second aspect of the present invention, a method of determining characteristics associated with a communication channel comprises the steps of: i.) transmitting a first signal via the communication channel; ii.) receiving a second signal via the communication channel in response to the first signal, wherein the second signal is associated with the first signal; iii.) performing frequency domain correlation between a frequency domain representation of the second signal and frequency domain representations of a plurality of time-delayed versions of the first signal to generate frequency domain correlation information; and iv.) identifying correlation peaks in a magnitude of the frequency domain correlation information to determine locations of discontinuities of the communication channel, wherein identified correlation peaks are associated with the locations of the discontinuities of the communication channel.

According to the second aspect, the step of identifying correlation peaks can comprise the step of: v.) identifying correlation peaks by determining where magnitudes of the frequency domain correlation information exceed at least one predetermined threshold function. The method of the second aspect can comprise the step of: vi.) determining a type of a located discontinuity from among a plurality of types of discontinuities by comparing an amplitude of the identified correlation peak with each of a plurality of predetermined threshold functions, wherein each type of discontinuity is associated with one of the plurality of predetermined threshold functions.

According to the second aspect, the communication channel can comprise a transmission line. A discontinuity of the communication channel can comprise one of an open connection in the communication channel, a short in the communication channel, a bridge tap of the communication channel, a change in characteristic impedance of the communication channel, and a discrete lump component, wherein the discrete lump component includes at least one of a resistor, a capacitor and an inductor. The first signal can comprise a stimulus signal. According to the method of the second aspect, the step of transmitting can comprise the step of: vii.) generating the stimulus signal. The second signal can comprise at least one reflection of the stimulus signal from at least one discontinuity of the communication channel. The stimulus signal can comprise a narrowband stimulus signal. The narrowband stimulus signal can mitigate effects of dispersion associated with the communication channel. The method can comprise the step of: viii.) adaptively determining a packet length of the narrowband stimulus signal based on attenuation associated with the communication channel. The narrowband stimulus signal can comprise sine packets windowed by, for example, a Blackman-Harris function.

According to the second aspect, the method comprises the steps of: ix.) generating an estimate of a baseline signal by applying the first signal to a model of the communication channel; and x.) mitigating baseline effects to the second signal by subtracting the estimated baseline signal from the second signal. The baseline signal can comprise a near-end echo of the first signal associated with transmission of the first signal, and the second signal can comprise the near-end echo and reflections of the first signal by discontinuities of the communication channel. According to the second aspect, the step of performing frequency domain correlation can further comprise the steps of: xi.) performing a Fourier transform on the second signal to generate the frequency domain representation of the second signal; xii.) generating the plurality of time-delayed versions of the first signal; and xiii.) performing Fourier transforms on the plurality of time-delayed versions of the first signal to generate the frequency domain representations of the plurality of time-delayed versions of the first signal. When at least one attribute of the communication channel is known a priori, a time delay of a first of the plurality of time-delayed versions of the first signal can be greater than zero. The at least one attribute of the communication channel known a priori can comprise, for example, a length of the communication channel in which there is an absence of discontinuities of the communication channel.

According to the second aspect, the method can comprise the steps of: xiv.) examining phase information associated with the frequency domain correlation information of the second signal relative to an associated time-delayed version of the first signal to determine a type of a discontinuity of the communication channel; xv.) calculating reflection coefficients for each identified correlation peak using at least the determined locations of the discontinuities of the communication channel; and xvi.) determining a topology of the communication channel using the reflection coefficients, wherein the phase information can be used for determining a sign of the reflection coefficients.

According to the second aspect, when the phase information is within a predetermined range, the sign of the reflection coefficient associated with the identified correlation peak is positive. When the phase information is outside the predetermined range, the sign of the reflection coefficient associated with the identified correlation peak is negative. When an amplitude of an identified correlation peak exceeds a predetermined threshold function and when the sign of the reflection coefficient associated with the identified correlation peak is positive, the type of discontinuity comprises an open. When an amplitude of an identified correlation peak exceeds a predetermined threshold function and when the sign of the reflection coefficient associated with the identified correlation peak is negative, the type of discontinuity comprises a short. When an amplitude of a first identified correlation peak is less than a first predetermined threshold function and greater than a second predetermined threshold function, and when the sign of the reflection coefficient associated with the first identified correlation peak is negative, the type of discontinuity comprises a bridge tap. A location of the first identified peak can comprise a location of the bridge tap. When an amplitude of a second identified correlation peak is greater than a third predetermined threshold function, and when the sign of the reflection coefficient associated with the second identified correlation peak is positive, a difference between a location of the second identified correlation peak and the location of the first identified peak can comprise a length of the bridge tap.

According to the second aspect, the method can comprise the steps of: xvii.) determining round trip loss of the communication channel to the determined location of the discontinuity using an amplitude of the identified correlation peak and an amplitude of a reference correlation peak; and xviii.) determining path loss of the communication channel to the determined location of the discontinuity using the determined round trip loss and at least one characteristic of a type of the discontinuity.

According to a third aspect of the present invention, a system for determining characteristics associated with a communication channel can include means for transmitting a first signal via the communication channel. The system can include means for receiving a second signal via the communication channel in response to the first signal. The second signal is associated with the first signal. The system can include means for performing frequency domain correlation between a frequency domain representation of the second signal and frequency domain representations of a plurality of time-delayed versions of the first signal to generate frequency domain correlation information. The system can include means for identifying correlation peaks in a magnitude of the frequency domain correlation information to determine locations of discontinuities of the communication channel. Identified correlation peaks are associated with the locations of the discontinuities of the communication channel.

According to the third aspect, the means for identifying can include means for identifying correlation peaks by determining where magnitudes of the frequency domain correlation information exceed at least one predetermined threshold function. According to the third aspect, the system can include means for determining a type of a located discontinuity from among a plurality of types of discontinuities by comparing an amplitude of the identified correlation peak with each of a plurality of predetermined threshold functions. Each type of discontinuity can be associated with one of the plurality of predetermined threshold functions.

According to the third aspect, the communication channel can comprise a transmission line. A discontinuity of the communication channel can comprise one of an open connection in the communication channel, a short in the communication channel, a bridge tap of the communication channel, a change in characteristic impedance of the communication channel, and a discrete lump component. The discrete lump component can include at least one of a resistor, a capacitor and an inductor. According to the third aspect, the first signal can comprise a stimulus signal. The means for transmitting can include means for generating the stimulus signal. The second signal can comprise at least one reflection of the stimulus signal from at least one discontinuity of the communication channel. The stimulus signal can comprise a narrowband stimulus signal. The narrowband stimulus signal can mitigate effects of dispersion associated with the communication channel. The system can include means for adaptively determining a packet length of the narrowband stimulus signal based on attenuation associated with the communication channel. The narrowband stimulus signal can comprise sine packets windowed by, for example, a Blackman-Harris function.

According to the third aspect, the system can include means for generating an estimate of a baseline signal by applying the first signal to a model of the communication channel. The system can include means for mitigating baseline effects to the second signal by subtracting the estimated baseline signal from the second signal. The baseline signal can comprise a near-end echo of the first signal associated with transmission of the first signal. The second signal can comprise the near-end echo and reflections of the first signal by discontinuities of the communication channel.

According to the third aspect, the means for performing frequency domain correlation can include: means for performing a Fourier transform on the second signal to generate the frequency domain representation of the second signal; means for generating the plurality of time-delayed versions of the first signal; and means for performing Fourier transforms on the plurality of time-delayed versions of the first signal to generate the frequency domain representations of the plurality of time-delayed versions of the first signal. When at least one attribute of the communication channel is known a priori, a time delay of a first of the plurality of time-delayed versions of the first signal can be greater than zero. The at least one attribute of the communication channel known a priori can comprise, for example, a length of the communication channel in which there is an absence of discontinuities of the communication channel.

According to the third aspect, the system can include means for examining phase information associated with the frequency domain correlation information of the second signal relative to an associated time-delayed version of the first signal to determine a type of a discontinuity of the communication channel. The system can include means for calculating reflection coefficients for each identified correlation peak using at least the determined locations of the discontinuities of the communication channel. The system can include means for determining a topology of the communication channel using the reflection coefficients. The phase information can be used for determining a sign of the reflection coefficients.

When the phase information is within a predetermined range, the sign of the reflection coefficient associated with the identified correlation peak is positive. When the phase information is outside the predetermined range, the sign of the reflection coefficient associated with the identified correlation peak is negative. When an amplitude of an identified correlation peak exceeds a predetermined threshold function and when the sign of the reflection coefficient associated with the identified correlation peak is positive, the type of discontinuity comprises an open. When an amplitude of an identified correlation peak exceeds a predetermined threshold function and when the sign of the reflection coefficient associated with the identified correlation peak is negative, the type of discontinuity comprises a short. When an amplitude of a first identified correlation peak is less than a first predetermined threshold function and greater than a second predetermined threshold function, and when the sign of the reflection coefficient associated with the first identified correlation peak is negative, the type of discontinuity comprises a bridge tap. A location of the first identified peak can comprise a location of the bridge tap. When an amplitude of a second identified correlation peak is greater than a third predetermined threshold function, and when the sign of the reflection coefficient associated with the second identified correlation peak is positive, a difference between a location of the second identified correlation peak and the location of the first identified peak can comprise a length of the bridge tap.

According to the third aspect, the system can includes means for determining round trip loss of the communication channel to the determined location of the discontinuity using an amplitude of the identified correlation peak and an amplitude of a reference correlation peak. The system can include means for determining path loss of the communication channel to the determined location of the discontinuity using the determined round trip loss and at least one characteristic of a type of the discontinuity.

According to a fourth aspect of the present invention, a system for determining characteristics associated with a communication channel can include a memory that stores the steps of a computer program to: i.) transmit a first signal via the communication channel; ii.) receive a second signal via the communication channel in response to the first signal, wherein the second signal is associated with the first signal; iii.) perform frequency domain correlation between a frequency domain representation of the second signal and frequency domain representations of a plurality of time-delayed versions of the first signal to generate frequency domain correlation information; and iv.) identify correlation peaks in a magnitude of the frequency domain correlation information to determine locations of discontinuities of the communication channel, wherein identified correlation peaks are associated with the locations of the discontinuities of the communication channel. The system can include a processor for accessing the memory to execute the computer program.

According to the fourth aspect, the memory can store steps of a computer program to: v.) identify correlation peaks by determining where magnitudes of the frequency domain correlation information exceed at least one predetermined threshold function; and vi.) determine a type of a located discontinuity from among a plurality of types of discontinuities by comparing an amplitude of the identified correlation peak with each of a plurality of predetermined threshold functions, wherein each type of discontinuity is associated with one of the plurality of predetermined threshold functions.

According to the fourth aspect, the communication channel can comprise a transmission line. A discontinuity of the communication channel can comprise one of an open connection in the communication channel, a short in the communication channel, a bridge tap of the communication channel, a change in characteristic impedance of the communication channel, and a discrete lump component. The discrete lump component can include at least one of a resistor, a capacitor and an inductor. According to the fourth aspect, the first signal can comprise a stimulus signal. The memory can store steps of a computer program to: vii.) generate the stimulus signal. The second signal can comprise at least one reflection of the stimulus signal from at least one discontinuity of the communication channel. The stimulus signal can comprise a narrowband stimulus signal. The narrowband stimulus signal can mitigate effects of dispersion associated with the communication channel. The memory stores steps of a computer program to: viii.) adaptively determine a packet length of the narrowband stimulus signal based on attenuation associated with the communication channel. The narrowband stimulus signal can comprise sine packets windowed by, for example, a Blackman-Harris function.

According to the fourth aspect, the memory can store steps of a computer program to: ix.) generate an estimate of a baseline signal by applying the first signal to a model of the communication channel; and x.) mitigate baseline effects to the second signal by subtracting the estimated baseline signal from the second signal. The baseline signal can comprise a near-end echo of the first signal associated with transmission of the first signal. The second signal can comprise the near-end echo and reflections of the first signal by discontinuities of the communication channel. For the step of performing frequency domain correlation, the memory can store steps of a computer program to: xi.) perform a Fourier transform on the second signal to generate the frequency domain representation of the second signal; xii.) generate the plurality of time-delayed versions of the first signal; and xiii.) perform Fourier transforms on the plurality of time-delayed versions of the first signal to generate the frequency domain representations of the plurality of time-delayed versions of the first signal. When at least one attribute of the communication channel is known a priori, a time delay of a first of the plurality of time-delayed versions of the first signal can be greater than zero. The at least one attribute of the communication channel known a priori can comprise, for example, a length of the communication channel in which there is an absence of discontinuities of the communication channel.

According to the fourth aspect, the memory can store steps of a computer program to: xiv.) examine phase information associated with the frequency domain correlation information of the second signal relative to an associated time-delayed version of the first signal to determine a type of a discontinuity of the communication channel; xv.) calculate reflection coefficients for each identified correlation peak using at least the determined locations of the discontinuities of the communication channel; and xvi.) determine a topology of the communication channel using the reflection coefficients, wherein the phase information can be used for determining a sign of the reflection coefficients.

According to the fourth aspect, when the phase information is within a predetermined range, the sign of the reflection coefficient associated with the identified correlation peak is positive. When the phase information is outside the predetermined range, the sign of the reflection coefficient associated with the identified correlation peak is negative. When an amplitude of an identified correlation peak exceeds a predetermined threshold function and when the sign of the reflection coefficient associated with the identified correlation peak is positive, the type of discontinuity comprises an open. When an amplitude of an identified correlation peak exceeds a predetermined threshold function and when the sign of the reflection coefficient associated with the identified correlation peak is negative, the type of discontinuity comprises a short. When an amplitude of a first identified correlation peak is less than a first predetermined threshold function and greater than a second predetermined threshold function, and when the sign of the reflection coefficient associated with the first identified correlation peak is negative, the type of discontinuity comprises a bridge tap. A location of the first identified peak can comprise a location of the bridge tap. When an amplitude of a second identified correlation peak is greater than a third predetermined threshold function, and when the sign of the reflection coefficient associated with the second identified correlation peak is positive, a difference between a location of the second identified correlation peak and the location of the first identified peak can comprise a length of the bridge tap.

According to the fourth aspect, the memory can stores steps of a computer program to: xvii.) determine round trip loss of the communication channel to the determined location of the discontinuity using an amplitude of the identified correlation peak and an amplitude of a reference correlation peak; xviii.) determine path loss of the communication channel to the determined location of the discontinuity using the determined round trip loss and at least one characteristic of a type of the discontinuity.

According to a fifth aspect of the present invention, a system for determining characteristics associated with a communication channel can include a transmitter for transmitting a first signal via the communication channel. The system can include a receiver for receiving a second signal via the communication channel in response to the first signal. The second signal is associated with the first signal. The system can include a correlator for performing frequency domain correlation between a frequency domain representation of the second signal and frequency domain representations of a plurality of time-delayed versions of the first signal to generate frequency domain correlation information. The system can include an analyzer for examining phase information associated with the frequency domain correlation information of the second signal relative to an associated time-delayed version of the first signal to determine a type of a discontinuity of the communication channel.

According to the fifth aspect, the communication channel can comprise a transmission line. A discontinuity of the communication channel can comprise one of an open connection in the communication channel, a short in the communication channel, a bridge tap of the communication channel, a change in characteristic impedance of the communication channel, and a discrete lump component. The discrete lump component can include at least one of a resistor, a capacitor and an inductor. The first signal can comprise a stimulus signal. The transmitter can comprise a stimulus generator for generating the stimulus signal. The second signal can comprise at least one reflection of the stimulus signal from at least one discontinuity of the communication channel. The stimulus signal can comprise a narrowband stimulus signal. The narrowband stimulus signal can mitigate effects of dispersion associated with the communication channel. The stimulus generator can adaptively determine a packet length of the narrowband stimulus signal based on attenuation associated with the communication channel. The narrowband stimulus signal can comprise sine packets windowed by, for example, a Blackman-Harris function.

According to the fifth aspect, the system can include means for generating an estimate of a baseline signal by applying the first signal to a model of the communication channel. The receiver can mitigate baseline effects to the second signal by subtracting the estimated baseline signal from the second signal. The baseline signal can comprise a near-end echo of the first signal associated with transmission of the first signal. The second signal can comprise the near-end echo and reflections of the first signal by discontinuities of the communication channel. According to the fifth aspect, the correlator can perform a Fourier transform on the second signal to generate the frequency domain representation of the second signal. The correlator can generate the plurality of time-delayed versions of the first signal. The correlator can perform Fourier transforms on the plurality of time-delayed versions of the first signal to generate the frequency domain representations of the plurality of time-delayed versions of the first signal. When at least one attribute of the communication channel is known a priori, a time delay of a first of the plurality of time-delayed versions of the first signal can be greater than zero. The at least one attribute of the communication channel known a priori can comprise, for example, a length of the communication channel in which there is an absence of discontinuities of the communication channel.

According to the fifth aspect, the analyzer can identify correlation peaks in a magnitude of the frequency domain correlation information to determine locations of discontinuities of the communication channel. The identified correlation peaks are associated with the locations of the discontinuities of the communication channel. The analyzer can identify correlation peaks by determining where magnitudes of the frequency domain correlation information exceed at least one predetermined threshold function. The analyzer can determine a type of a located discontinuity from among a plurality of types of discontinuities by comparing an amplitude of the identified correlation peak with each of a plurality of predetermined threshold functions. Each type of discontinuity can be associated with one of the plurality of predetermined threshold functions. According to the fifth aspect, the analyzer can calculate reflection coefficients for each identified correlation peak using at least the determined locations of the discontinuities of the communication channel, and can determine a topology of the communication channel using the reflection coefficients. The phase information can be used for determining a sign of the reflection coefficients.

According to the fifth aspect, when the phase information is within a predetermined range, the sign of the reflection coefficient associated with the identified correlation peak is positive. When the phase information is outside the predetermined range, the sign of the reflection coefficient associated with the identified correlation peak is negative. When an amplitude of an identified correlation peak exceeds a predetermined threshold function and when the sign of the reflection coefficient associated with the identified correlation peak is positive, the type of discontinuity comprises an open. When an amplitude of an identified correlation peak exceeds a predetermined threshold function and when the sign of the reflection coefficient associated with the identified correlation peak is negative, the type of discontinuity comprises a short. When an amplitude of a first identified correlation peak is less than a first predetermined threshold function and greater than a second predetermined threshold function, and when the sign of the reflection coefficient associated with the first identified correlation peak is negative, the type of discontinuity comprises a bridge tap. A location of the first identified correlation peak can comprise a location of the bridge tap. When an amplitude of a second identified correlation peak is greater than a third predetermined threshold function, and when the sign of the reflection coefficient associated with the second identified correlation peak is positive, a difference between a location of the second identified correlation peak and the location of the first identified peak can comprise a length of the bridge tap.

According to the fifth aspect, the analyzer can determine round trip loss of the communication channel to the determined location of the discontinuity using an amplitude of the identified correlation peak and an amplitude of a reference correlation peak. The analyzer can determine path loss of the communication channel to the determined location of the discontinuity using the determined round trip loss and at least one characteristic of a type of the discontinuity.

According to a sixth aspect of the present invention, a method of determining characteristics associated with a communication channel can comprise the steps of: i.) transmitting a first signal via the communication channel; ii.) receiving a second signal via the communication channel in response to the first signal, wherein the second signal is associated with the first signal; iii.) performing frequency domain correlation between a frequency domain representation of the second signal and frequency domain representations of a plurality of time-delayed versions of the first signal to generate frequency domain correlation information; and iv.) examining phase information associated with the frequency domain correlation information of the second signal relative to an associated time-delayed version of the first signal to determine a type of a discontinuity of the communication channel.

According to the sixth aspect, the communication channel can comprise a transmission line. A discontinuity of the communication channel can comprise one of an open connection in the communication channel, a short in the communication channel, a bridge tap of the communication channel, a change in characteristic impedance of the communication channel, and a discrete lump component. The discrete lump component can include at least one of a resistor, a capacitor and an inductor. The first signal can comprise a stimulus signal. The step of transmitting can comprise the step of: v.) generating the stimulus signal. The second signal can comprise at least one reflection of the stimulus signal from at least one discontinuity of the communication channel. The stimulus signal can comprise a narrowband stimulus signal. The narrowband stimulus signal can mitigate effects of dispersion associated with the communication channel. The method can comprise the step of: vi.) adaptively determining a packet length of the narrowband stimulus signal based on attenuation associated with the communication channel. The narrowband stimulus signal can comprise sine packets windowed by, for example, a Blackman-Harris function.

According to the sixth aspect, the method can comprise the steps of: vii.) generating an estimate of a baseline signal by applying the first signal to a model of the communication channel; and viii.) mitigating baseline effects to the second signal by subtracting the estimated baseline signal from the second signal. The baseline signal can comprise a near-end echo of the first signal associated with transmission of the first signal. The second signal can comprise the near-end echo and reflections of the first signal by discontinuities of the communication channel. According to the sixth aspect, the step of performing frequency domain correlation can comprise the steps of: ix.) performing a Fourier transform on the second signal to generate the frequency domain representation of the second signal; x.) generating the plurality of time-delayed versions of the first signal; and xi.) performing Fourier transforms on the plurality of time-delayed versions of the first signal to generate the frequency domain representations of the plurality of time-delayed versions of the first signal. When at least one attribute of the communication channel is known a priori, a time delay of a first of the plurality of time-delayed versions of the first signal can be greater than zero. The at least one attribute of the communication channel known a priori can comprise, for example, a length of the communication channel in which there is an absence of discontinuities of the communication channel.

According to the sixth aspect, the method can comprise the steps of: xii.) identifying correlation peaks in a magnitude of the frequency domain correlation information to determine locations of discontinuities of the communication channel, wherein identified correlation peaks are associated with the locations of the discontinuities of the communication channel. The step of identifying correlation peaks can comprise the step of: xiii.) determining where magnitudes of the frequency domain correlation information exceed at least one predetermined threshold function. According to the sixth aspect, the method can comprise the step of: xiv.) determining a type of a located discontinuity from among a plurality of types of discontinuities by comparing an amplitude of the identified correlation peak with each of a plurality of predetermined threshold functions, wherein each type of discontinuity can be associated with one of the plurality of predetermined threshold functions.

According to the sixth aspect, the method can comprise the steps of: xv.) calculating reflection coefficients for each identified correlation peak using at least the determined locations of the discontinuities of the communication channel; and xvi.) determining a topology of the communication channel using the reflection coefficients, wherein the phase information can be used for determining a sign of the reflection coefficients. When the phase information is within a predetermined range, the sign of the reflection coefficient associated with the identified correlation peak is positive. When the phase information is outside the predetermined range, the sign of the reflection coefficient associated with the identified correlation peak is negative. When an amplitude of an identified correlation peak exceeds a predetermined threshold function and when the sign of the reflection coefficient associated with the identified correlation peak is positive, the type of discontinuity comprises an open. When an amplitude of an identified correlation peak exceeds a predetermined threshold function and when the sign of the reflection coefficient associated with the identified correlation peak is negative, the type of discontinuity comprises a short. When an amplitude of a first identified correlation peak is less than a first predetermined threshold function and greater than a second predetermined threshold function, and when the sign of the reflection coefficient associated with the first identified correlation peak is negative, the type of discontinuity comprises a bridge tap. A location of the first identified peak can comprise a location of the bridge tap. When an amplitude of a second identified correlation peak is greater than a third predetermined threshold function, and when the sign of the reflection coefficient associated with the second identified correlation peak is positive, a difference between a location of the second identified correlation peak and the location of the first identified peak can comprise a length of the bridge tap.

According to the sixth aspect, the method can comprise the steps of: xvii.) determining round trip loss of the communication channel to the determined location of the discontinuity using an amplitude of the identified correlation peak and an amplitude of a reference correlation peak; and xviii.) determining path loss of the communication channel to the determined location of the discontinuity using the determined round trip loss and at least one characteristic of a type of the discontinuity.

According to a seventh aspect of the present invention, a system for determining characteristics associated with a communication channel can include means for transmitting a first signal via the communication channel. The system can include means for receiving a second signal via the communication channel in response to the first signal. The second signal is associated with the first signal. The system can include means for performing frequency domain correlation between a frequency domain representation of the second signal and frequency domain representations of a plurality of time-delayed versions of the first signal to generate frequency domain correlation information. The system can include means for examining phase information associated with the frequency domain correlation information of the second signal relative to an associated time-delayed version of the first signal to determine a type of a discontinuity of the communication channel.

According to the seventh aspect, the communication channel can comprise a transmission line. A discontinuity of the communication channel can comprise one of an open connection in the communication channel, a short in the communication channel, a bridge tap of the communication channel, a change in characteristic impedance of the communication channel, and a discrete lump component. The discrete lump component can include at least one of a resistor, a capacitor and an inductor. The first signal can comprise a stimulus signal. According to the seventh aspect, the means for transmitting can comprise means for generating the stimulus signal. The second signal can comprise at least one reflection of the stimulus signal from at least one discontinuity of the communication channel. The stimulus signal can comprise a narrowband stimulus signal. The narrowband stimulus signal can mitigate effects of dispersion associated with the communication channel. The system can include means for adaptively determining a packet length of the narrowband stimulus signal based on attenuation associated with the communication channel. The narrowband stimulus signal can comprise sine packets windowed by, for example, a Blackman-Harris function.

According to the seventh aspect, the system can include means for generating an estimate of a baseline signal by applying the first signal to a model of the communication channel. The system can include means for mitigating baseline effects to the second signal by subtracting the estimated baseline signal from the second signal. The baseline signal can comprise a near-end echo of the first signal associated with transmission of the first signal. The second signal can comprise the near-end echo and reflections of the first signal by discontinuities of the communication channel. According to the seventh aspect, the means for performing frequency domain correlation can comprise: means for performing a Fourier transform on the second signal to generate the frequency domain representation of the second signal; means for generating the plurality of time-delayed versions of the first signal; and means for performing Fourier transforms on the plurality of time-delayed versions of the first signal to generate the frequency domain representations of the plurality of time-delayed versions of the first signal. When at least one attribute of the communication channel is known a priori, a time delay of a first of the plurality of time-delayed versions of the first signal can be greater than zero. The at least one attribute of the communication channel known a priori can comprise, for example, a length of the communication channel in which there is an absence of discontinuities of the communication channel.

According to the seventh aspect, the system can include means for identifying correlation peaks in a magnitude of the frequency domain correlation information to determine locations of discontinuities of the communication channel. The identified correlation peaks are associated with the locations of the discontinuities of the communication channel. The means for identifying correlation peaks can include means for determining where magnitudes of the frequency domain correlation information exceed at least one predetermined threshold function. The system can include means for determining a type of a located discontinuity from among a plurality of types of discontinuities by comparing an amplitude of the identified correlation peak with each of a plurality of predetermined threshold functions. Each type of discontinuity can be associated with one of the plurality of predetermined threshold functions.

According to the seventh aspect, the system can include means for calculating reflection coefficients for each identified correlation peak using at least the determined locations of the discontinuities of the communication channel. The system can include means for determining a topology of the communication channel using the reflection coefficients. The phase information can be used for determining a sign of the reflection coefficients. When the phase information is within a predetermined range, the sign of the reflection coefficient associated with the identified correlation peak is positive. When the phase information is outside the predetermined range, the sign of the reflection coefficient associated with the identified correlation peak is negative. When an amplitude of an identified correlation peak exceeds a predetermined threshold function and when the sign of the reflection coefficient associated with the identified correlation peak is positive, the type of discontinuity comprises an open. When an amplitude of an identified correlation peak exceeds a predetermined threshold function and when the sign of the reflection coefficient associated with the identified correlation peak is negative, the type of discontinuity comprises a short. When an amplitude of a first identified correlation peak is less than a first predetermined threshold function and greater than a second predetermined threshold function, and when the sign of the reflection coefficient associated with the first identified correlation peak is negative, the type of discontinuity comprises a bridge tap. A location of the first identified peak can comprise a location of the bridge tap. When an amplitude of a second identified correlation peak is greater than a third predetermined threshold function, and when the sign of the reflection coefficient associated with the second identified correlation peak is positive, a difference between a location of the second identified correlation peak and the location of the first identified peak can comprise a length of the bridge tap.

According to the seventh aspect, the system can include means for determining round trip loss of the communication channel to the determined location of the discontinuity using an amplitude of the identified correlation peak and an amplitude of a reference correlation peak. The system can include means for determining path loss of the communication channel to the determined location of the discontinuity using the determined round trip loss and at least one characteristic of a type of the discontinuity.

According to an eighth aspect of the present invention, a system for determining characteristics associated with a communication channel can include a memory that stores the steps of a computer program to: i.) transmit a first signal via the communication channel; ii.) receive a second signal via the communication channel in response to the first signal, wherein the second signal is associated with the first signal; iii.) perform frequency domain correlation between a frequency domain representation of the second signal and frequency domain representations of a plurality of time-delayed versions of the first signal to generate frequency domain correlation information; and iv.) examine phase information associated with the frequency domain correlation information of the second signal relative to an associated time-delayed version of the first signal to determine a type of a discontinuity of the communication channel. The system can include a processor for accessing the memory to execute the computer program.

According to the eighth aspect, the communication channel can comprise a transmission line. A discontinuity of the communication channel can comprise one of an open connection in the communication channel, a short in the communication channel, a bridge tap of the communication channel, a change in characteristic impedance of the communication channel, and a discrete lump component. The discrete lump component can include at least one of a resistor, a capacitor and an inductor. The first signal can comprise a stimulus signal. According to the eighth aspect, for the step of transmitting, the memory can store the step of a computer program to: v.) generate the stimulus signal. The second signal can comprise at least one reflection of the stimulus signal from at least one discontinuity of the communication channel. The stimulus signal can comprise a narrowband stimulus signal. The narrowband stimulus signal can mitigate effects of dispersion associated with the communication channel. The memory can store the steps of a computer program to: vi.) adaptively determine a packet length of the narrowband stimulus signal based on attenuation associated with the communication channel. The narrowband stimulus signal can comprise sine packets windowed by, for example, a Blackman-Harris function.

According to the eighth aspect, the memory can store steps of a computer program to: vii.) generate an estimate of a baseline signal by applying the first signal to a model of the communication channel; and viii.) mitigate baseline effects to the second signal by subtracting the estimated baseline signal from the second signal. The baseline signal can comprise a near-end echo of the first signal associated with transmission of the first signal. The second signal can comprise the near-end echo and reflections of the first signal by discontinuities of the communication channel. According to the eighth aspect, for the step of performing frequency domain correlation, the memory can store steps of a computer program to: ix.) perform a Fourier transform on the second signal to generate the frequency domain representation of the second signal; x.) generate the plurality of time-delayed versions of the first signal; and xi.) perform Fourier transforms on the plurality of time-delayed versions of the first signal to generate the frequency domain representations of the plurality of time-delayed versions of the first signal. When at least one attribute of the communication channel is known a priori, a time delay of a first of the plurality of time-delayed versions of the first signal can be greater than zero. The at least one attribute of the communication channel known a priori can comprise, for example, a length of the communication channel in which there is an absence of discontinuities of the communication channel.

According to the eighth aspect, the memory can store steps of a computer program to: xii.) identify correlation peaks in a magnitude of the frequency domain correlation information to determine locations of discontinuities of the communication channel. The identified correlation peaks are associated with the locations of the discontinuities of the communication channel. The memory can store steps of a computer program to: xiii.) determine where magnitudes of the frequency domain correlation information exceed at least one predetermined threshold function; and xiv.) determine a type of a located discontinuity from among a plurality of types of discontinuities by comparing an amplitude of the identified correlation peak with each of a plurality of predetermined threshold functions. Each type of discontinuity can be associated with one of the plurality of predetermined threshold functions.

According to the eighth aspect, the memory can store steps of a computer program to: xv.) calculate reflection coefficients for each identified correlation peak using at least the determined locations of the discontinuities of the communication channel; and xvi.) determine a topology of the communication channel using the reflection coefficients. The phase information can be used for determining a sign of the reflection coefficients. When the phase information is within a predetermined range, the sign of the reflection coefficient associated with the identified correlation peak is positive. When the phase information is outside the predetermined range, the sign of the reflection coefficient associated with the identified correlation peak is negative. When an amplitude of an identified correlation peak exceeds a predetermined threshold function and when the sign of the reflection coefficient associated with the identified correlation peak is positive, the type of discontinuity comprises an open. When an amplitude of an identified correlation peak exceeds a predetermined threshold function and when the sign of the reflection coefficient associated with the identified correlation peak is negative, the type of discontinuity comprises a short. When an amplitude of a first identified correlation peak is less than a first predetermined threshold function and greater than a second predetermined threshold function, and when the sign of the reflection coefficient associated with the first identified correlation peak is negative, the type of discontinuity comprises a bridge tap. A location of the first identified peak can comprise a location of the bridge tap. When an amplitude of a second identified correlation peak is greater than a third predetermined threshold function, and when the sign of the reflection coefficient associated with the second identified correlation peak is positive, a difference between a location of the second identified correlation peak and the location of the first identified peak can comprise a length of the bridge tap.

According to the eighth aspect, the memory can store steps of a computer program to: xvii.) determine round trip loss of the communication channel to the determined location of the discontinuity using an amplitude of the identified correlation peak and an amplitude of a reference correlation peak; and xviii.) determine path loss of the communication channel to the determined location of the discontinuity using the determined round trip loss and at least one characteristic of a type of the discontinuity.

According to a ninth aspect of the present invention, a stimulus-response system for determining characteristics associated with a communication channel can include a stimulus generator for generating a stimulus signal. The stimulus signal can comprise a narrowband stimulus signal. The narrowband stimulus signal can mitigate effects of dispersion associated with the communication channel. The system can include a receiver for receiving a response signal via the communication channel in response to the narrowband stimulus signal. The response signal can comprise at least one reflection of the narrowband stimulus signal from at least one discontinuity of the communication channel.

According to the ninth aspect, the stimulus generator can adaptively determine a packet length of the narrowband stimulus signal based on attenuation associated with the communication channel. The narrowband stimulus signal can comprise sine packets windowed by, for example, a Blackman-Harris function. The system can includes means for generating an estimate of a baseline signal by applying the narrowband stimulus signal to a model of the communication channel. The receiver can mitigate baseline effects to the response signal by subtracting the estimated baseline signal from the response signal. The baseline signal can comprise a near-end echo of the narrowband stimulus signal associated with transmission of the narrowband stimulus signal. The response signal can comprise the near-end echo and reflections of the narrowband stimulus signal by discontinuities of the communication channel.

According to the ninth aspect, the system can include a correlator for performing frequency domain correlation between a frequency domain representation of the response signal and frequency domain representations of a plurality of time-delayed versions of the narrowband stimulus signal to generate frequency domain correlation information. The system can include an analyzer for identifying correlation peaks in a magnitude of the frequency domain correlation information to determine locations of discontinuities of the communication channel. The identified correlation peaks are associated with the locations of the discontinuities of the communication channel. The correlator can perform a Fourier transform on the response signal to generate the frequency domain representation of the response signal. The correlator can generate the plurality of time-delayed versions of the narrowband stimulus signal. The correlator can perform Fourier transforms on the plurality of time-delayed versions of the narrowband stimulus signal to generate the frequency domain representations of the plurality of time-delayed versions of the narrowband stimulus signal.

According to the ninth aspect, a discontinuity of the communication channel can comprise one of an open connection in the communication channel, a short in the communication channel, a bridge tap of the communication channel, a change in characteristic impedance of the communication channel, and a discrete lump component. The discrete lump component can include at least one of a resistor, a capacitor and an inductor.

According to the ninth aspect, the analyzer can examine phase information associated with the frequency domain correlation information of the response signal relative to an associated time-delayed version of the narrowband stimulus signal to determine a type of a discontinuity of the communication channel. The analyzer can determine round trip loss of the communication channel to the determined location of the discontinuity using an amplitude of the identified correlation peak and an amplitude of a reference correlation peak. The analyzer can determine path loss of the communication channel to the determined location of the discontinuity using the determined round trip loss and at least one characteristic of a type of the discontinuity.

According to a tenth aspect of the present invention, a stimulus-response method for determining characteristics associated with a communication channel comprises the steps of: i.) generating a stimulus signal, wherein the stimulus signal comprises a narrowband stimulus signal, and wherein the narrowband stimulus signal mitigates effects of dispersion associated with the communication channel; and ii.) receiving a response signal via the communication channel in response to the narrowband stimulus signal, wherein the response signal comprises at least one reflection of the narrowband stimulus signal from at least one discontinuity of the communication channel.

According to the tenth aspect, the step of generating can comprise the step of: iii.) adaptively determining a packet length of the narrowband stimulus signal based on attenuation associated with the communication channel. The narrowband stimulus signal can comprise sine packets windowed by, for example, a Blackman-Harris function. A discontinuity of the communication channel can comprise one of an open connection in the communication channel, a short in the communication channel, a bridge tap of the communication channel, a change in characteristic impedance of the communication channel, and a discrete lump component. The discrete lump component can include at least one of a resistor, a capacitor and an inductor.

According to the tenth aspect, the method can comprise the steps of: iv.) generating an estimate of a baseline signal by applying the narrowband stimulus signal to a model of the communication channel; and v.) mitigating baseline effects to the response signal by subtracting the estimated baseline signal from the response signal. The baseline signal can comprise a near-end echo of the narrowband stimulus signal associated with transmission of the narrowband stimulus signal. The response signal can comprise the near-end echo and reflections of the narrowband stimulus signal by discontinuities of the communication channel. The method can comprise the steps of: vi.) performing frequency domain correlation between a frequency domain representation of the response signal and frequency domain representations of a plurality of time-delayed versions of the narrowband stimulus signal to generate frequency domain correlation information; and vii.) identifying correlation peaks in a magnitude of the frequency domain correlation information to determine locations of discontinuities of the communication channel, wherein identified correlation peaks are associated with the locations of the discontinuities of the communication channel.

According to the tenth aspect, the step of performing frequency domain correlation can comprise the steps of: viii.) performing a Fourier transform on the response signal to generate the frequency domain representation of the response signal; ix.) generating the plurality of time-delayed versions of the narrowband stimulus signal; and x.) performing Fourier transforms on the plurality of time-delayed versions of the narrowband stimulus signal to generate the frequency domain representations of the plurality of time-delayed versions of the narrowband stimulus signal. According to the tenth aspect, the method can comprise the steps of: xi.) examining phase information associated with the frequency domain correlation information of the response signal relative to an associated time-delayed version of the narrowband stimulus signal to determine a type of a discontinuity of the communication channel; xii.) determining round trip loss of the communication channel to the determined location of the discontinuity using an amplitude of the identified correlation peak and an amplitude of a reference correlation peak; and xiii.) determining path loss of the communication channel to the determined location of the discontinuity using the determined round trip loss and at least one characteristic of a type of the discontinuity.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein:

FIG. 2C is an illustration of the normalized magnitude spectrums of the stimulus signals illustrated in FIGS. 2A and 2B, in accordance with an exemplary embodiment of the present invention.

DETAILED DESCRIPTION OF THE PREFERRED EMBODIMENTS

A system and method are disclosed for determining characteristics associated with a communication channel. In accordance with an exemplary embodiment of the present invention, Blackman-Harris windowed sine packets or other narrowband signals can be used as the stimulus for a time domain reflectometer (TDR) to address the dispersion of the communication channel. The stimulus is reflected back when it encounters discontinuities, such as an open, short, bridge tap or other discontinuities, in the communication channel. A frequency domain correlation routine can be applied to detect the location of these discontinuities. The frequency domain correlation routine can correlate Fourier transforms of the reflected signals with Fourier transforms of a series of time-delayed versions of the stimulus in the frequency domain, and then determine the location of the discontinuities by searching for the peaks of the magnitude of the frequency domain correlation results. The nature of the discontinuity can be determined by examining the phase information contained in the reflection, relative to the optimum time-delayed stimulus version. Knowing the nature of the discontinuity, the normalized amplitude of the correlation peaks can be utilized to estimate the round trip loss to the location of the selected discontinuity. The path loss to the location of the selected discontinuity can then be estimated by dividing the round trip loss by two.

As used herein, a "disc ontinuity" of the communication channel can be, for example, an open connection in the communication channel, a short in the communication channel, a bridge tap of the communication channel, a change in characteristic impedance of the communication channel, or a discrete lump component. The discrete lump component can include at least one of a resistor, a capacitor and an inductor. However, the discontinuity of the communication channel can be any type of discontinuity that can cause a reflection of a stimulus signal.

Figure 1:
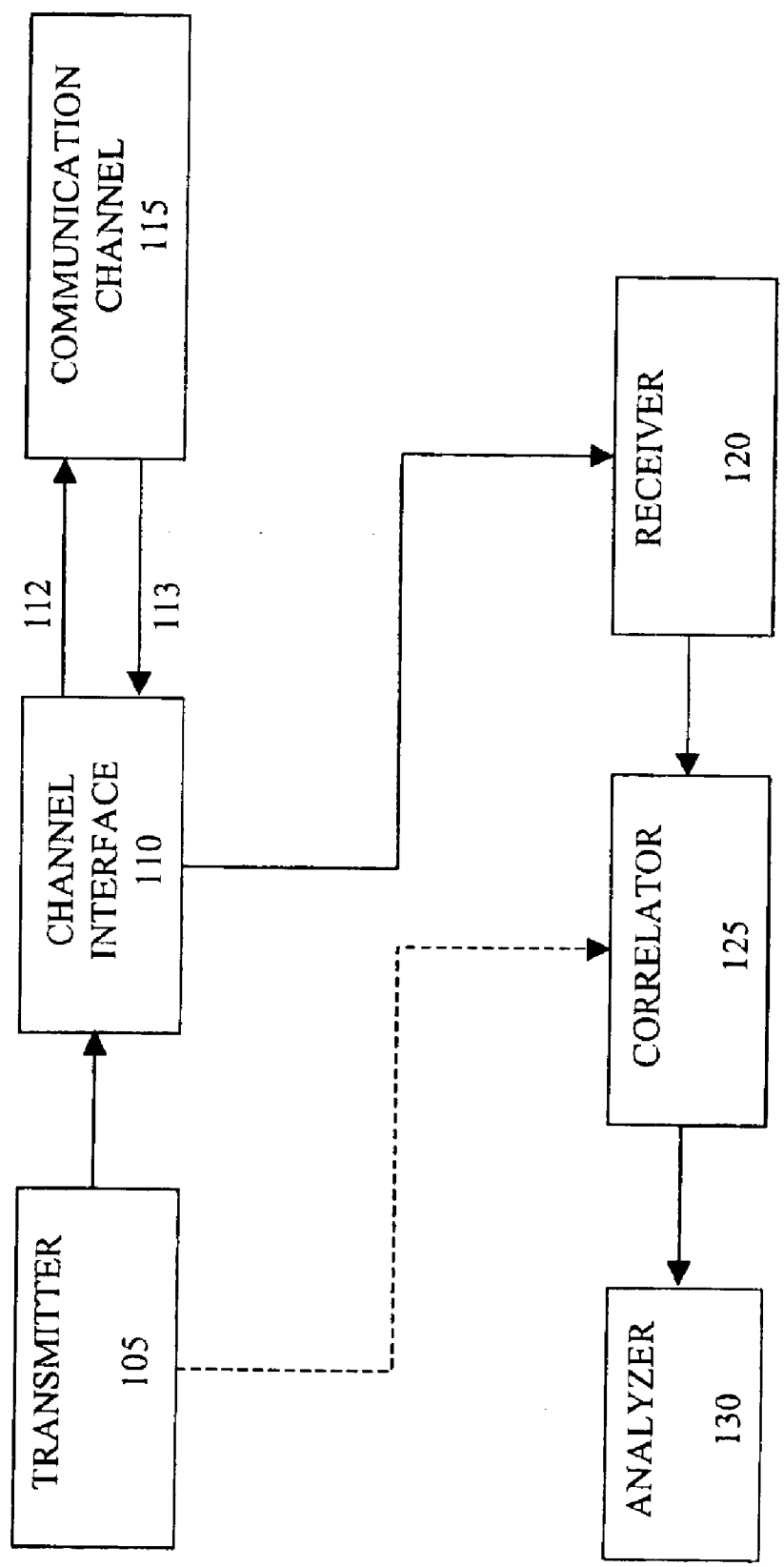
FIG. 1 is a diagram illustrating a system for determining characteristics associated with a communication channel, in accordance with an exemplary embodiment of the present invention.

These and other aspects of the present invention will now be described in greater detail. FIG. 1 is a diagram illustrating a system 100 for determining characteristics associated with a communication channel, in accordance with an exemplary embodiment of the present invention. The system 100 can include a transmitter 105 for transmitting a first signal via the communication channel, such as communication channel 115. The transmitter 105 can be any type of electrical or electronic component or device that is capable of transmitting information over a communication channel, such as communication channel 115. For example, transmitter 105 can be any type of signal generation device, such as, for example, a stimulus pulse generator, for generating a signal to be transmitted over the communication channel 115. Alternatively, transmitter 105 can be any type of signal modulator for modulating a signal for transmission over the communication channel 115.

Alternatively or additionally, the transmitter 105 can be comprised of any type of processor, such as, for example, any type of microprocessor, microcontroller, digital signal processor (DSP), application-specific integrated circuit (ASIC), programmable read-only memory (PROM), erasable programmable read-only memory (EPROM), electrically-erasable programmable read-only memory (EEPROM), or the like. The transmitter 105 can include, for example, a memory that can be any type of computer memory or any other type of electronic storage medium that is located either internally or externally to transmitter 105, such as, for example, read-only memory (ROM), random access memory (RAM), cache memory, compact disc read-only memory (CDROM), electro-optical memory, magneto-optical memory, or the like. The memory of transmitter 105 can be used, for example, to store pre-calculated waveforms for the first signal or supply stored parameters for the processor to allow the processor to generate the first signal. As will be appreciated based on the following description, the memory of transmitter 105 can, for example, be programmed using conventional techniques known to those having ordinary skill in the art of computer programming. The actual source code or object code of a computer program for transmitting the first signal, or for performing any or all of the functions described herein for transmitter 105, can be stored in the memory. However, transmitter 105 can be any type of transmission device, or any combination of hardware, firmware and software, for transmitting the first signal via the communication channel 115.

Additionally, the transmitter 105 can include a digital-to-analog converter (DAC) for converting the first signal from a digital representation to its corresponding analog representation for transmission, for example, if the first signal is a generated or stored and retrieved as a digital representation. The DAC can be any type of electrical or electronic device capable of converting digital information into corresponding analog information. However, the transmitter 105 can include any additional or alternative electrical or electronic components for use in transmitting the first signal.

The transmitter 105 can be connected to the communication channel, such as communication channel 115, using any type of electrical connection capable of communicating electrical information. For example, transmitter 105 can be connected to the communication channel using a channel interface 110. The transmitter 105 can be connected to the channel interface 110 using any type of electrical connection capable of communicating electrical information. Channel interface 110 can be any type of electrical or electronic device or interface that is capable of connecting or otherwise interfacing transmitter 105 and other electrical or electronic devices to and from communication channel 115. For example, channel interface 110 can be a switch connected to the communication channel 115 to switch between a transmission line 112 and a receiving line 113 of the system 100. The switch can be any type of electrical or electronic switch that can be used for switchably connecting the communication channel 115 to one of any number of other communications lines within system 100. For example, the switch can be initially configured such that the transmission line 112 is connected to the communication channel 115. When the first signal has been transmitted by transmitter 105, the connection to the communications 115 can be switched from the transmission line 112 to the receiver line 113 so that a second signal can be received accordingly. However, direct connections between the communication channel 115 and the transmission and receiver lines 112 and 113, respectively, can be made instead of the switchable connections using the switch. However, channel interface 110 can be any type of electrical or electronic device, interface or connection that is capable of connecting or otherwise interfacing components of system 100 to and from communication channel 115.

According to exemplary embodiments, the communication channel 115 can be, for example, a twisted pair of wires, as are commonly used to transport telecommunications signals. The communication channel 115 can be, however, any type of communications medium over which the first signal can be transmitted, such as, for example, a wire or other electrical cable, a fiber optic cable, an acoustic medium, a medium for propagating electromagnetic waves, or the like. According to an exemplary embodiment, the communication channel 115 can comprise a transmission line.

The system 100 can include a receiver 120 for receiving a second signal via the communication channel 115 in response to the first signal. According to exemplary embodiments, the second signal is associated with the first signal. The receiver 120 can be any type of electrical or electronic component or device that is capable of receiving information over the communication channel 115. For example, receiver 120 can be any type of signal reception device, such as, for example, a sampled data receiver, for sampling data received over the communication channel 115. Alternatively or in addition, the receiver 120 can be comprised of any type of processor and memory, such as the same or different processor and memory that can be used in or for transmitter 105. However, receiver 120 can be any type of receiver device for receiving the second signal via the communication channel 115 in response to the first signal.

The receiver 120 can be connected to the communication channel 115 using any type of electrical connection capable of communicating electrical information. For example, receiver 120 can be connected to the communication channel 115 using the channel interface 110. The receiver 120 can be connected to the channel interface 110 using any type of electrical connection capable of communicating electrical information.

According to an exemplary embodiment, the first signal can comprise a stimulus signal. According to the exemplary embodiment, the transmitter 105 can comprise a stimulus generator for generating the stimulus signal. The stimulus generator can be any type of electrical or electronic device or component capable of generating a stimulus signal according to exemplary embodiments. The second signal can comprise at least one reflection of the stimulus signal from at least one discontinuity of the communication channel 115. According to exemplary embodiments, the stimulus signal can comprise a narrowband stimulus signal. The narrowband stimulus signal can mitigate the effects of dispersion associated with the communication channel. For example, the narrowband stimulus signal can comprise sine packets windowed by a Blackman-Harris function. However, the narrowband stimulus signal can comprise any function or polynomial designed to minimize packet length consistent with a constrained stimulus bandwidth. The actual narrowband stimulus signal chosen will depend on the desired compromise between such factors as bandwidth, out-of-band rejection, time interval, computational speed and the like.

According to exemplary embodiments, the effects of dispersion in the communication channel 115 can be substantially mitigated by applying a narrowband signal, instead of a broadband signal as used in, for example, conventional TDR. According to one embodiment, sine packets windowed by a Blackman-Harris function can be used as the narrowband stimulus signal, as given by the stimulus pulse pt(t) in Equation (1):

$$pt(t) = V * \left( a_1 - a_2 * \cos\left(\frac{2\pi t}{NT_c}\right) + a_3 * \cos\left(\frac{4\pi t}{NT_c}\right) \right) * \left( \sin\left(\frac{2\pi t}{T_c}\right) \right) \quad (1)$$

Figure 2A:
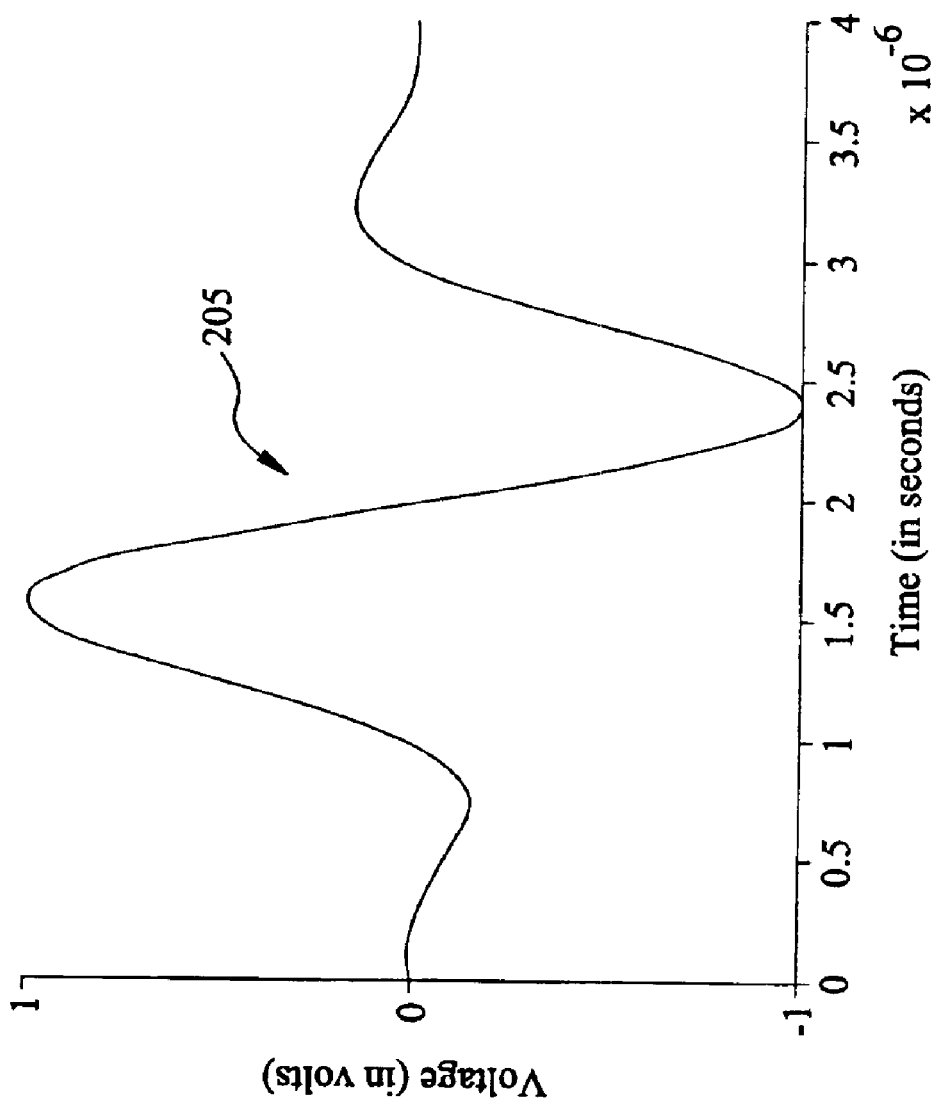
FIG. 2A illustrates an exemplary two-cycle 500 kHz Blackman-Harris windowed sine packet stimulus pulse, in accordance with an exemplary embodiment of the present invention.
Figure 2B:
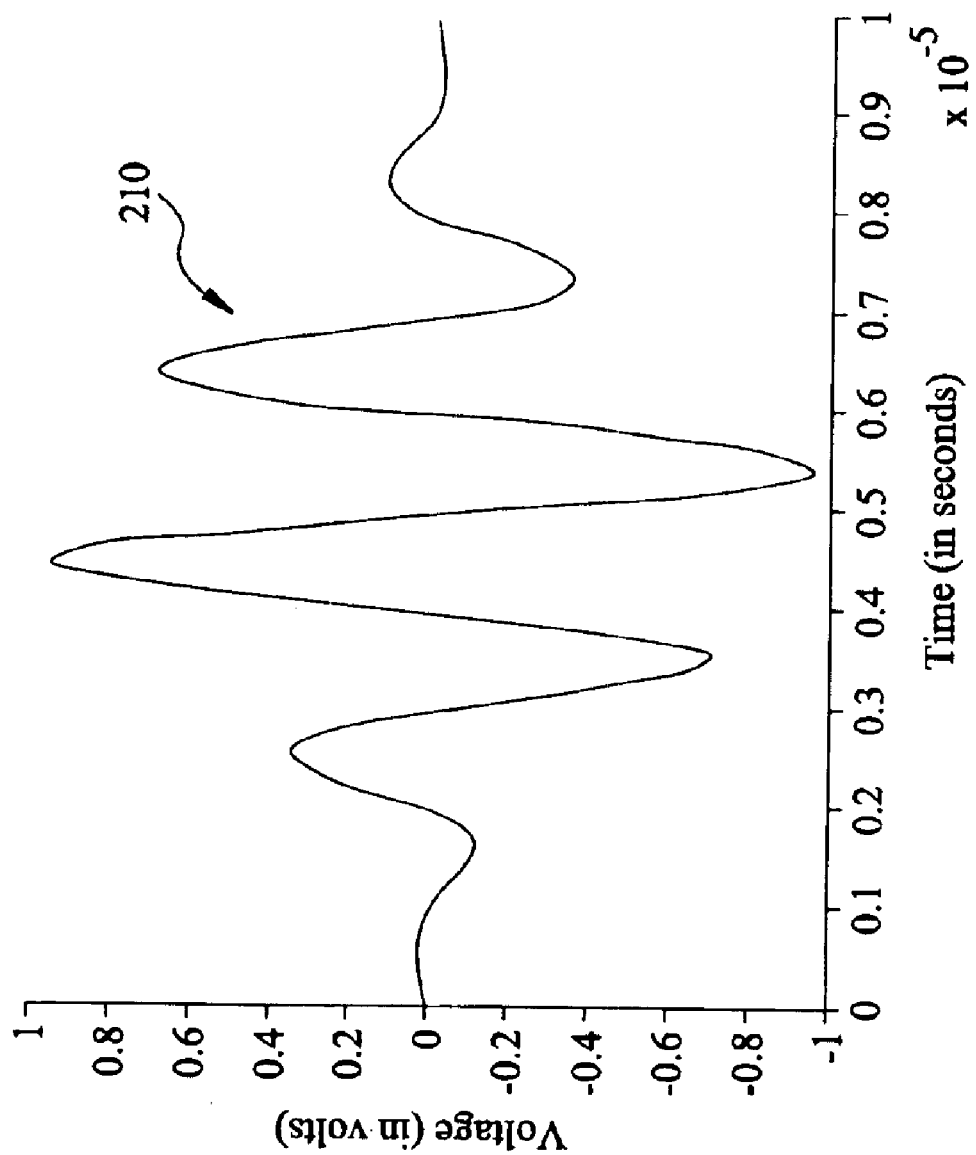
FIG. 2B illustrates an exemplary five-cycle 500 kHz Blackman-Harris windowed sine packet stimulus pulse, in accordance with an exemplary embodiment of the present invention.

In Equation (1), $1/T_c$ is the center frequency, N is the number of cycles in the sine packet, and $a_1$, $a_2$ and $a_3$ are parameters of the Blackman-Harris window. For example, for a center frequency of 500 kHz, the parameters can be taken as $a_1=0.84646$, $a_2=0.99510$ and $a_3=0.15844$, although other values can be used, depending on the narrowband waveform desired. An exemplary two-cycle 500 kHz Blackman-Harris windowed sine packet stimulus pulse −pt(t) 205 is illustrated in FIG. 2A, while an exemplary five-cycle 500 kHz Blackman-Harris windowed sine packet stimulus pulse pt(t) 210 is illustrated in FIG. 2B. The Blackman-Harris window can greatly reduce the side lobes of the stimulus, and, hence, can substantially mitigate the effects of dispersion. FIG. 2C is an illustration of the normalized magnitude spectrum 215 of the two-cycle stimulus pulse 205, and the normalized magnitude spectrum 220 of the five-cycle stimulus pulse 210. As shown in FIG. 2C, the frequency components of the stimuli are centered around the center frequency and the side lobes are attenuated by nearly 70 dB, in the present example.

However, various other windowed stimulus signals can be used in accordance with exemplary embodiments of the present invention. For such windowed stimulus signals, the longer the stimulus, the narrower the frequency band around the center frequency (i.e., the narrower the spectrum).

The dispersion effect of the communication channel 115 can be different for communication channels 115 of different length. According to exemplary embodiments, the stimulus generator (e.g., transmitter 105) can adaptively determine a packet length of the narrowband stimulus signal based on attenuation associated with the communication channel. For example, if a two-period stimulus signal is used and a potential correlation peak is identified (as described below), but the amplitude of the correlation peak is too small to make a confident identification, the packet length of the stimulus signal can be increased to, for example, a five-period stimulus signal or any length stimulus signal so the stimulus signal can carry more power. Using a longer length stimulus signal, the frequency domain correlation according to exemplary embodiments would result in a larger correlation peak if a discontinuity actually does exist at the given location, thereby improving the identification. However, if the period of the stimulus becomes excessive, resolution may become impaired. Thus, the packet length of the stimulus signal can also be based on the spacing of any identified discontinuities of the communication channel. Other adaptive algorithms can also be used.

According to exemplary embodiments, since the frequency components are in a narrow band around the center frequency, the velocity factor and attenuation at the center frequency can be implemented to detect the discontinuities in the TDR application and estimate the path loss in a testing system utilizing the reflected signal, resulting in much higher accuracy. Since the time domain correlation of a bi-polar signal will also be bi-polar, it can be difficult to implement the time domain correlation method to detect the discontinuities, particularly in the presence of multiple closely spaced discontinuities. However, according to exemplary embodiments, with the observation that the magnitude spectrum of the narrow band stimulus is uni-polar and its side lobes are highly attenuated, the correlation can be implemented in the frequency domain. According to exemplary embodiments, the correlation peaks can be found from the frequency domain correlation between the spectra of time shifted version of the stimulus signal and the spectra of the reflected signal. The correlation peaks are directly related the location of the discontinuities.

The system 100 can include a correlator 125 for performing frequency domain correlation between a frequency domain representation of the second signal and frequency domain representations of a plurality of time-delayed versions of the first signal to generate frequency domain correlation information. The correlator 125 can be any type of electrical or electronic component or device that is capable of performing the frequency domain correlation. For example, the correlator can be comprised of a processor and memory, such as the same or different processor and memory that can be used for transmitter 105 and receiver 120. For example, the processor of correlator 125 can be used to generate the frequency domain representation of the second signal and frequency domain representations of the plurality of time-delayed versions of the first signal. For example, the memory of correlator 125 can be used, for example, to store the time-delayed versions of the first signal or supply stored parameters to the processor to allow the processor to generate such time-delayed versions of the first signal. As will be appreciated based on the following description, the memory of correlator 125 can, for example, be programmed using conventional techniques known to those having ordinary skill in the art of computer programming. The actual source code or object code of a computer program for performing the frequency domain correlation, or for performing any or all of the functions described herein for correlator 125, can be stored in the memory. However, correlator 125 can be any type of correlation device, or any combination of hardware, firmware and software, for performing the frequency domain correlation.

According to exemplary embodiments, the time-domain-to-frequency-domain conversions can be performed by any means, such as any electrical or electronic component or device, capable of converting a time-domain signal into its corresponding frequency domain representation. The time-domain-to-frequency-domain conversion means can be a functional component of, for example, the receiver 120 or the correlator 125, or can be a separate functional component of system 100, such as, for example, at the output of receiver 120 and at the input of the correlator 125. According to an exemplary embodiment of the present invention, the correlator 125 can perform a Fourier transform on the second signal to generate the frequency domain representation of the second signal. For example, the correlator 125 can perform a Fast Fourier Transform (FFT) or other similar algorithm on the second signal to generate the frequency domain representation of the second signal. According to exemplary embodiments, the correlator 125 can generate the plurality of time-delayed versions of the first signal. The time-delayed versions of the first signal can be used to match the delay of the communication channel 115. For example, the correlator 125 can be in electrical communication with the transmitter 105 so as to obtain a replica or copy of the first signal, such as a stimulus pulse, transmitted by transmitter 105. Alternatively, the correlator 125 can retrieve a replica or copy of the first signal, such as the stimulus pulse, from a memory associated with correlator 125. Using the replica or copy of the first signal, the correlator 125 can then generate time-delayed versions of the first signal. However, the time-delayed versions of the first signal can be generated by other components of system 100, such as transmitter 105 or receiver 120.

The time delays can be spaced over any desired time interval and can be of any length to achieve any desired granularity in measurement. For example, the time delays can be based on the characteristics of the communication channel 115, such as, for example, from time zero to the predefined maximal round trip time of a signal through the communication channel 115. The predefined maximal round trip time should be at least larger than the round trip time of the furthest discontinuity of the communication channel under test. According to exemplary embodiments, the correlator 125 can perform Fourier transforms on the plurality of time-delayed versions of the first signal to generate the frequency domain representations of the plurality of time-delayed versions of the first signal. In other words, repeated application of the Fourier transform operation can generate, one at a time, the frequency domain representations of each of the plurality of time-delayed versions of the first signal. For example, the correlator 125 can perform a Fast Fourier Transform (FFT) or other similar algorithm on the plurality of time-delayed versions of the first signal to generate the frequency domain representations of such signals.

According to an exemplary embodiment, the time delay of the first of the plurality of time-delayed versions of the first signal can be greater than zero, when at least one attribute of the communication channel 115 is know a priori.

For example, the at least one attribute of the communication channel 115 known a priori can be a length of the communication channel in which there is an absence of discontinuities of the communication channel 115, or any other channel information. For example, if it is known that no discontinuities exist in communication channel 115 before d seconds, then the time-delayed versions of the first signal can be generated from Equation (1) according to Equation (2):

$$\text{pt\_delay}(t) = \begin{cases} 0, & \text{if } t \leq d \\ pt(t), & \text{if } t > d \end{cases} \quad (2)$$

In other words, if the normalized peak value at delay d is "$p_d$", where the delay d ranges from $0 \leq d \leq d_{max}$ (where $d_{max}$ can be, for example, the predefined maximal round trip time or any other value greater than the starting time delay value), then the vector of normalized peak values can have the form of $p_d = [p_0, p_1, \ldots, p_{dmax}]$. However, if no discontinuity exists before distance $D = d_m * v/2$ (where $d_m$ is the delay in seconds that is smaller than the delay to the first discontinuity), then the delay d can range from $d_m \leq d \leq d_{max}$, resulting in a vector of the form $p_{d\_partial} = [p_{dm}, p_{dm+1}, \ldots, p_{dmax}]$. In such a time-delayed version of the vector, since the frequency domain correlation calculations do not start from zero, then according to an exemplary embodiment, leading zeroes can be added to the partial vector to yield a vector of the form $p_d = [0, 0, \ldots, p_{dm}, p_{dm+1}, \ldots, p_{dmax}]$, where the number of leading zeroes is equal to $d_m$. Thus, according to exemplary embodiments, by specifying the start and end time delays of the plurality of time-delayed versions of the first signal (i.e., the time delay of the first time-delayed version of the first signal and the time delay of the last time-delayed version of the first signal), discontinuities can be detected within any specified range of distance along the communication channel 115. Consequently, any possible discontinuities that exist within the range $d_m \leq d \leq d_{max}$ can be determined with less computational burden.

Figure 3:
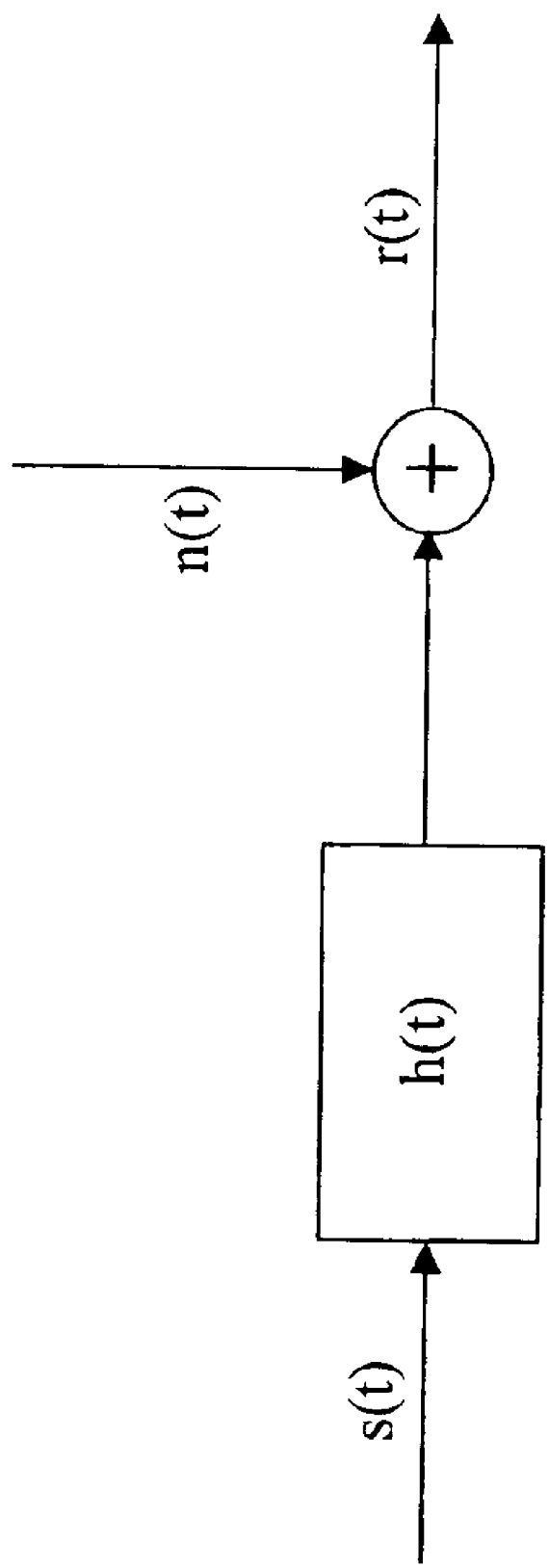
FIG. 3 is a diagram illustrating an equivalent communication channel of a test system, in accordance with an exemplary embodiment of the present invention.

FIG. 3 is a diagram illustrating an equivalent communication channel of a test system, in accordance with an exemplary embodiment of the present invention. In FIG. 3, s(t) is the stimulus signal, h(t) is the impulse response of the communication channel, n(t) is white gaussian noise, and r(t) is the received signal from the discontinuities of the channel under test. According to FIG. 3:

$$r(t) = s(t) \hat{X} h(t) + n(t) \quad (3)$$

Taking the Fourier transform of Equation (3) yields:

$$R(f) = S(f) H(f) + N(f) \quad (4)$$

where $$R(f) = |R(f)| \angle R(f)$$
$$S(f) = |S(f)| \angle S(f)$$
$$H(f) = |H(f)| \angle H(f)$$
$$N(f) = |N(f)| \angle N(f)$$

Let $s_d(t)$ denote the time-delayed version of s(t), where $S_d(f)$ is the Fourier transform of $s_d(t)$. Taking the correlation of $S_d(f)$ and R(f) as follows, where "xcorr" represents complex correlation:

$$xcorr(Sd(f), R(f)) = xcorr(S_d(f), S(f)H(f)) + xcorr(S_d(f), N(f)) \quad (5)$$

$$= xcorr(|S(f)|LS_d(f), |S(f)||H(f|(LS(f) +$$

$$LH(f))) + xcorr(|S(f)|LS_d(f), |N(f)|LN(f))$$

$$= \sum |S(f)|^2 |H(f)|(LS_d(f) - LS(f) - LH(f)) +$$

$$\sum |S(f)||N(f)|(LS_d(f) - LN(f))$$

$$= \sum_{f \in f_c} |S(f)|^2 |H(f)|(LS_d(f) - LS(f) - LH(f)) +$$

$$\sum_{f \in f_c} |S(f)|^2 |H(f)|(LS_d(f) - S(f) - LH(f)) +$$

$$\sum_{f \in f_c} |S(f)||N(f)|(LS_d(f) - LN(f)) +$$

$$\sum_{f \in f_c} |S(f)||N(f)|(LS_d(f) - LN(f))$$

$$= \sum_{f \in f_c} |S(f)|^2 |H(f)|(LS_d(f) - LS(f) - LH(f)) +$$

$$\sum_{f \in f_c} |S(f)||N(f)|(LS_d(f) - LN(f))$$

The last line of Equation (5) can also include very small correlation results from, for example, frequency components outside the frequency band of interest. In Equation (5), $f_c = [f_1, f_2]$ and denotes a frequency set around the center frequency. In other words, $f_1$ is the beginning and $f_2$ is the end of the considered narrowband frequency of the stimulus. The $f_1$ and $f_2$ can be selected such that the frequency band dominated by noise is not included in the determination of the correlation, with the actual frequencies selected depending upon the application. However, for the center frequency, higher frequency can lead to higher attenuation. For example, if it is desired to determine the attenuation at 300 kHz, then 300 kHz would be taken as the center frequency, although any desired center frequency can be used. According to exemplary embodiments, the $f_1$ and $f_2$ can be selected as $f_1 = f_{center} - \Delta f_1$ and $f_2 = f_{center} \Delta f_2$, where $\Delta f_1$ and $\Delta f_2$ can be, for example, 100 kHz, or any other desired frequency spreads. Consequently, according to exemplary embodiments, the magnitude response of the reflected signal outside the frequency set $[f_1, f_2]$ can be quite small and can fall into the noise floor, and, hence, should not be used for the frequency domain correlation determination. The noise effect can be reduced by, for example, either applying a longer stimulus or increasing the average number of measurements.

The last line of Equation (5) represents the frequency domain complex correlation of the frequency domain representation of the second (reflected) signal and the frequency domain representation of the time-delayed versions of the first (stimulus) signal (e.g., a narrowband stimulus signal or pulse), in accordance with exemplary embodiments of the present invention. The very small correlation results from frequency components outside the frequency band of interest that can be included in the last line of Equation (5) result from the fact that the applied narrowband stimulus signal has very low energy outside the frequency band of interest.

The system 100 can include an analyzer 130 for identifying correlation peaks in a magnitude of the frequency domain correlation information to determine locations of discontinuities of the communication channel 1115. The analyzer 130 can be any type of electrical or electronic component or device that is capable of identifying peaks in the magnitude of the frequency domain correlation information. For example, the analyzer 130 can be comprised of any type of processor and memory, such as the same or different processor and memory that can be used for transmitter 105, receiver 120 and correlator 125. As will be appreciated based on the following description, the memory of analyzer 130 can, for example, be programmed using conventional techniques known to those having ordinary skill in the art of computer programming. The actual source code or object code of a computer program for performing the identification of correlation peaks in the magnitude of the frequency domain correlation information, or for performing any or all of the functions described herein for analyzer 130, can be stored in the memory. However, analyzer 130 can be any type of analyzer device, or any combination of hardware, firmware and software, for performing the correlation peak identification.

According to exemplary embodiments, the identified correlation peaks are associated with the locations of the discontinuities of the communication channel 115. In other words, the locations of the discontinuities can be found by maximizing the magnitude of the complex correlation of the last line of Equation (5), as follows:

$$d_{opt} = \max_d |xcorr(S_d(f), R(f))| \quad (6)$$

where $d_{opt}$ is the delay (in seconds) to the discontinuity. Thus, according to exemplary embodiments, the analyzer 130 can identify correlation peaks by determining where magnitudes of the frequency domain correlation information exceed at least one predetermined threshold function. The predetermined threshold functions can be functions dependent on time or, correspondingly, distance. The predetermined threshold functions can be based on anticipated loss as dependent on distance for the medium of the communication channel. The anticipated loss can be approximately similar to the actual communication channel loss versus distance, as exemplary embodiments of the present invention differentiate between discontinuity types using amplitude when there is no distinctive phase signature.

Once the correlation peaks have been identified, the location of the discontinuities can be determined by multiplying one-half the round-trip time (i.e., one-half of $d_{opt}$ from Equation (6)) to the discontinuity with the phase velocity. According to exemplary embodiments, since the stimulus signal can be a narrowband stimulus signal centered around a center or carrier frequency (e.g., 500 kHz or any other desired center frequency), then the velocity of the center frequency can be used in the aforementioned calculation to determine the location of the discontinuity accurately.

Thus, according to exemplary embodiments, at each time delay d, where d can range from $d_0$ (e.g., 0 or other delayed value if prior knowledge of the communication channel is known) to $d_{max}$ (e.g., the predefined maximal round trip time), the frequency domain correlation can be performed between the frequency domain representation of the reflected signal and frequency domain representations of the time delayed versions of the stimulus signal. The resulting frequency domain correlation values can be used to form a vector, the elements of which are the magnitude of the frequency domain correlation values. The vector can be plotted verses the time delay d (integer multiples of the sampling interval T), over the range of $d_0$ to $d_{max}$. The discontinuities in the communication channel within the specified range can be determined by identifying the correlation peaks in the resulting plot.

For purposes of illustration and not limitation, an example of the application of exemplary embodiments will now be described. For the present illustration, the two-cycle stimulus of FIG. 2A can be applied to a 15000 foot, #24 gauge, Gel-filled twisted-pair circuit. For the present illustration, the time delay can be taken as 0 seconds, the predefined maximal round trip time can be taken as 125 $\mu$secs (thus, the time-shifted versions of the stimulus can range from 0 seconds to 125 $\mu$secs), and the frequency set around the center frequency of 500 kHz (i.e., [$f_1$, $f_2$]) can be taken as $f_1$=0 Hz and $f_2$=8.3125 MHz. The resolution of the measurements is directly determined by the sample interval. For the present illustration, the sample interval can be taken as, for example, 62.5 nsecs, which corresponds to approximately twenty feet resolution.

Figure 4A:
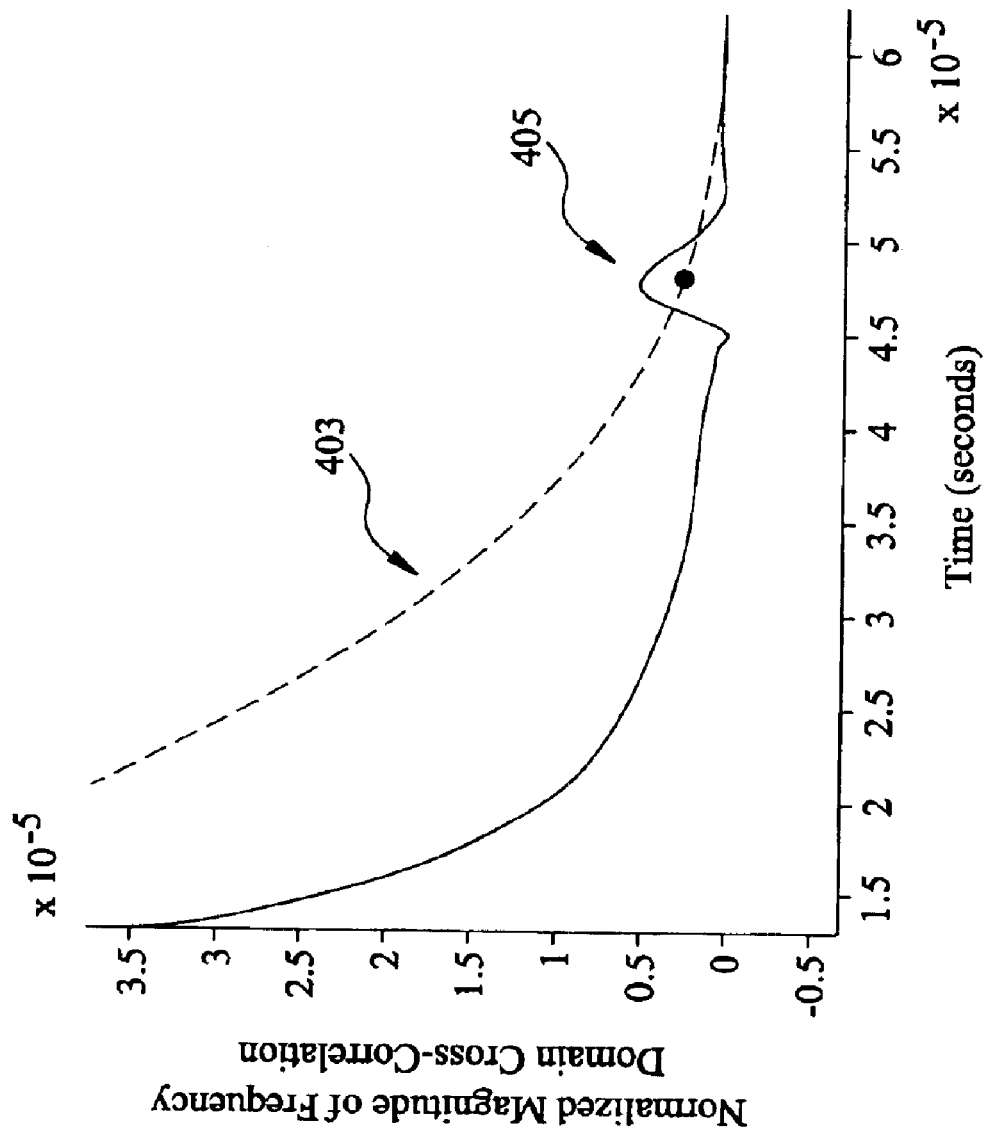
FIG. 4A illustrates the normalized magnitude of the frequency domain correlation between the spectra of the time-shifted stimulus and the spectra of the reflected signal, in accordance with an exemplary embodiment of the present invention.

FIG. 4A illustrates the normalized magnitude of the frequency domain correlation between the spectra of the time-shifted stimulus and the spectra of the reflected signal, according to exemplary embodiments. In FIG. 4A, a peak 405 can be identified by analyzer 130 in the magnitude of the frequency domain correlation information. According to exemplary embodiments, the analyzer 130 can determine where the magnitude of the frequency domain correlation information exceeds a predetermined threshold function 403 to identify the correlation peaks. Assuming for the present example that the magnitude of peak 405 is larger than the value of the predetermined threshold function 403 (e.g., 0.3×10$^{-5}$) at the location of peak 405 (represented by the dot along threshold function 403 in FIG. 4A), then the analyzer 130 can identify peak 405 as a correlation peak. The predetermined threshold functions can be functions of the delay or distance and can be altered for determining different discontinuities. For example, threshold values at different distances can be set as a function of the normalized magnitude of the frequency domain correlation of the potential discontinuities based on approximate attenuation information of the communication channel. The characteristic impedance of the communication channel or any other prior knowledge of the communication channel can be used for setting such threshold functions.

According to exemplary embodiments, the analyzer 130 can determine a type of a located discontinuity from among a plurality of types of discontinuities by comparing an amplitude of the identified correlation peak with each of a plurality of predetermined threshold functions. Each type of discontinuity can be associated with one of the plurality of predetermined threshold functions. For example, if the identified correlation peak exceeds a first predetermined threshold function, but is less than a second predetermined threshold function, the type of the discontinuity associated with the correlation peak can be a bridge tap of the communication channel, or other appropriate discontinuity. For example, if the identified correlation peak exceeds the second predetermined threshold function, but is less than a third predetermined threshold function, the type of the discontinuity can be an open connection or a short in the communication channel, or other appropriate discontinuity. For example, according to an exemplary embodiment of the present invention, the magnitude of the frequency domain correlation information (i.e., a correlation peak) for a bridge tap can be approximately one-third that of an open or short. Thus, the value of the correlation peak would be approximately one-third of that from a open/short at the same location. Consequently, if the predetermined threshold function is set at, for example, two-thirds, a bridge tap can be determined from an open/short. Similar threshold functions can be set to separate other discontinuities, such as a change in characteristic impedance from a bridge tap and an open/short. Other predetermined threshold functions can be chosen to determine the type of other discontinuities of the communication channel.

According to exemplary embodiments, since the stimulus signal can be transmitted and received on, for example, a common twisted-pair, a certain amount of the transmitted signal can overlap with the reflections from the discontinuities of the communication channel 115. The component of the received signal that comes directly from the transmitter 105 with substantially no time delay can be referred to as the "near-end echo." The near-end echo can result from voltage division at the junction of the transmitter 105 and communication channel 115 when the hybrid balance is imperfect or absent. In many cases, the near-end echo can be significantly larger than the reflection from the communication channel discontinuities. Thus, a baseline signal can comprise a near-end echo of the first signal associated with transmission of the first signal, and the second signal can be comprised of both the near-end echo and reflections of the first signal by discontinuities of the communication channel 115. According to an exemplary embodiment, the contribution of the near-end echo can be removed by subtracting an estimated baseline signal from the second signal to mitigate baseline effects to the second signal. In other words, the option of mitigating the baseline effect to the reflected signal can be achieved by subtracting from the actual received reflected signal the estimated based line signal generated by applying the same stimulus to a modeled extremely long transmission line. The subtraction can be performed by, for example, the receiver 120 before the correlator 125 performs the frequency domain correlation.

Thus, according to exemplary embodiments, the system 100 can optionally include a means for generating an estimate of the baseline signal by applying the first signal to a model of the communication channel 115. The means for generating can be, for example, any type of processor and any type of associated memory, with the memory suitably programmed to simulate the communication channel 115, apply a replica or copy of the first signal to the simulated communication channel 115, and determining the baseline signal from the near-end echo generated according to the simulation. However, the means for generating can be any suitable means capable of generating the estimate of the baseline signal. The estimate of the baseline signal can be generated a priori. The estimate of the baseline signal can be stored, for example, in a memory associated with the receiver 120. The receiver 120 can then retrieve the estimate of the baseline signal from memory for subtraction from second signal.

Figure 4B:
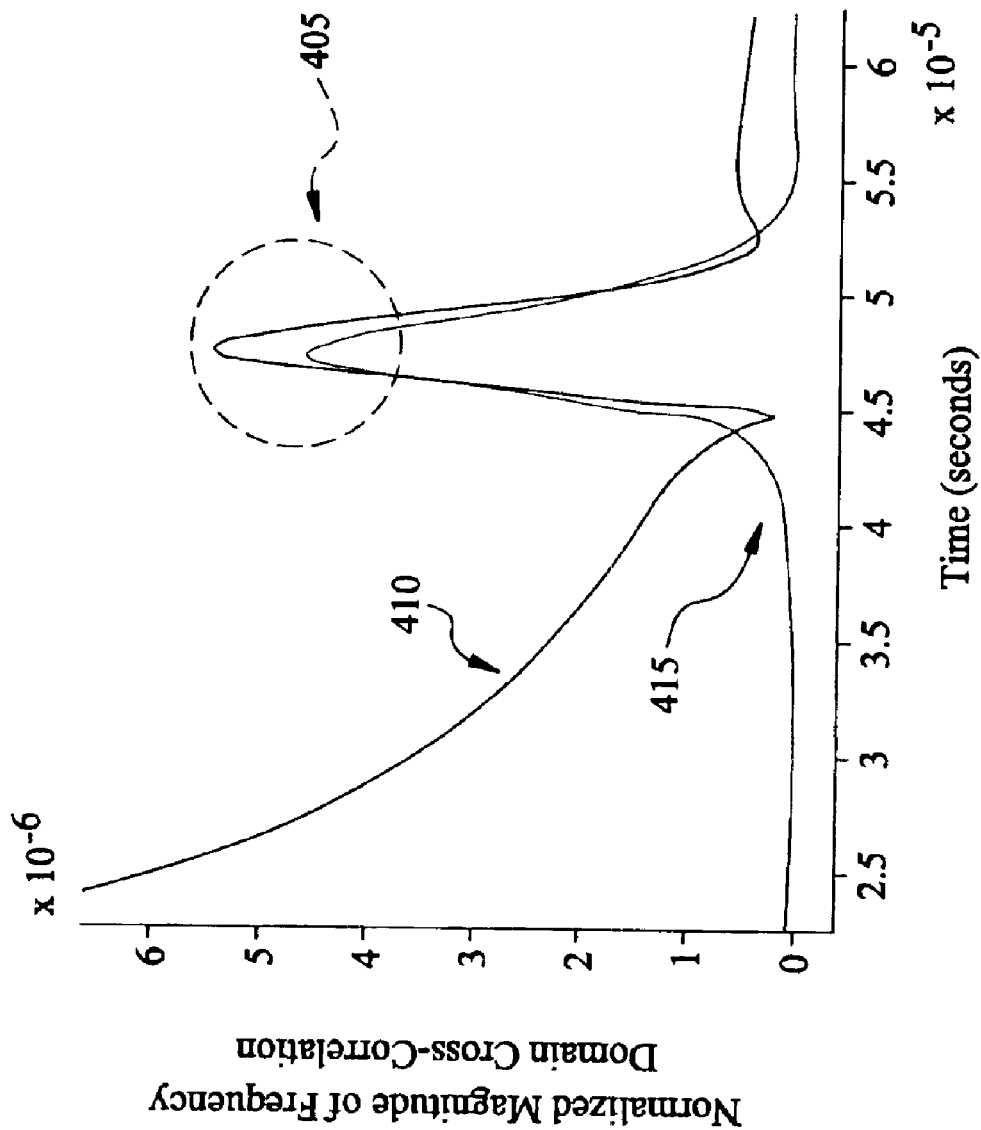
FIG. 4B illustrates a comparison of the normalized magnitude of the frequency domain correlation between the spectra of the time-shifted stimulus and the spectra of the reflected signal with and without the use of mitigation of baseline effects to a reflected signal, in accordance with an exemplary embodiment of the present invention.

FIG. 4B illustrates a comparison of the normalized magnitude of the frequency domain correlation between the spectra of the time-shifted stimulus and the spectra of the reflected signal with and without the use of mitigation of baseline effects to a reflected signal, in accordance with an exemplary embodiment of the present invention. In FIG. 4B, graph 410 represents the normalized magnitude of the frequency domain correlation between the spectra of the time-shifted stimulus and the spectra of the reflected signal, as shown in FIG. 4A, without the use of mitigation of baseline effects to a reflected signal. Graph 415 represents the normalized magnitude of the frequency domain correlation between the spectra of the time-shifted stimulus and the spectra of the reflected signal, as shown in FIG. 4A, with the use of mitigation of baseline effects to a reflected signal. As shown in FIG. 4B, correlation peak 405 can be more easily identified using graph 415 with the baseline effects to the reflected signal mitigated, in contrast to graph 410 where the baseline effects to the reflected signal are not mitigated.

According to exemplary embodiments, the analyzer 130 can determine round trip loss of the communication channel 115 to the determined location of the discontinuity using an amplitude of the identified correlation peak and an amplitude of a reference correlation peak. To obtain the reference correlation peak, the information of the actual signal transmitted on the communication channel can be used. If no hybrid balance circuitry exists in the channel interface 110, the actual transmitted signal on the communication channel can be measured, which will result from the voltage division at the junction of transmitter 105 and communication channel 115. Denoting the source impedance as $Z_g$ and the characteristic impedance of the communication channel as $Z_o$, the actual transmitted signal $V_T$ can be expressed in Equation (7) as:

$$V_T = \frac{V_g}{1 + \frac{Z_g}{Z_o}} \quad (7)$$

where $V_g$ is the source signal. Similarly, the reflected signal actually captured at the receiver can be subject to a potential second discontinuity if $Z_g$ is not equal to $Z_o$. The communication channel discontinuity can alter the portion of the reflected signal coupled to the receiver. Thus, if the reflected signal from a discontinuity of reflection coefficient ρ is $V_R$, then the actual received reflected signal $V_r$ at the receiver can be expressed in Equation (8) as:

$$V_r = \left(\frac{2}{1 + \frac{Z_o}{Z_g}}\right) * V_R \quad (8)$$

Note, however, that the communication channel round trip attenuation is included in the reflected signal $V_R$. Hence, the reference correlation peak can be obtained by taking the magnitude of the frequency domain correlation between the frequency domain representation of the signal of $(2/(1+(Z_o/Z_g)))*V_T$ and the frequency domain representation of the stimulus signal.

The communication channel incident characteristic impedance $Z_o$ can first be determined by evaluating the following Equation (9):

$$Z_o = \frac{Z_g}{\left(\frac{V_g}{V_T} - 1\right)} \quad (9)$$

Note that if $Z_g$ is adapted to be equal to $Z_o$, by, for example, observing that when $V_T=V_g/2$, then $V_r=V_R$, then the reference correlation peak can be obtained by taking the magnitude of the frequency domain correlation between the frequency domain representation of the signal $V_T$ and the frequency domain representation of the stimulus signal. When the hybrid balance circuitry exists, the actual transmitted signal $V_T$ is known and the actual received reflected signal $V_r$ at the receiver is equal to the reflected signal $V_R$ returning from the communication channel discontinuity. According to exemplary embodiments, the reference correlation peak can be obtained by taking the magnitude of the frequency domain correlation between the frequency domain representation of the signal $V_T$ and the frequency domain representation of the stimulus signal.

For example, denote the reference correlation peak at time delay zero as "$p_r$" and correlation peak value at delay "d" as "$p_d$". The distance to the discontinuity can be obtained from D=d*v/2, where v is the velocity of the signal transmitted in the communication channel within the stimulus bandwidth. The attenuation for the round trip of 2*D is given in Equation (10), as follows:

$$\text{ATTENUATION} = 20 * \log_{10}\left(\frac{p_r}{p_d}\right) \quad (10)$$

In general, the path loss to the far end of the communication channel can be determined, where the reflection coefficient of the selected discontinuity can be "+1," if it exists. According to exemplary embodiments, the analyzer 130 can determine the path loss of the communication channel 115 to the determined location of the discontinuity using the determined round trip loss and at least one characteristic of a type of the discontinuity. In other words, knowing the nature of any intervening discontinuity, the path loss to the location of the selected discontinuity can be determined. The path loss can generally be determined by dividing the round trip loss by two. However, the allocation of the forward and return components of the round trip loss can be modified if certain intervening discontinuities exist, such as, for example, a bridge tap connected to a transmission line junction with different characteristic impedances. If the path loss to a selected discontinuity of reflection coefficient ρ is to be determined, then the round trip loss obtained from Equation (10) can be adjusted by subtracting $20*\log_{10}(|\rho|)$ before determining the path loss.

As noted previously, whenever the traveling stimulus signal encounters a discontinuity, a portion of the stimulus can be reflected back. An index of the "amount" of signal that is reflected back is given by the reflection coefficient ρ(f), as follows:

$$\rho(f) = \frac{Z_2 - Z_1}{Z_2 + Z_1} \quad (11)$$

In Equation (11), $Z_1$ and $Z_2$ are the characteristic impedances before and after the discontinuity, respectively. Generally, the reflection coefficient is a complex function of frequency. The reflection coefficient becomes a "+1" if the discontinuity is an open connection, and a "−1" if the discontinuity is a short. According to exemplary embodiments, the location information of the discontinuities can be determined by searching the peaks of the normalized magnitude of the frequency domain correlation. To fully identify the complex reflection coefficients at each identified peak, the angle or sign of the reflection coefficients should be determined in addition to the location. The angle or sign of the reflection coefficients can be determined from the phase information of the reflected signal relative to the time-delayed version of the stimulus signal.

Thus, according to exemplary embodiments, the analyzer 130 can examine the phase information associated with the frequency domain correlation information of the second signal relative to an associated time-delayed version of the first signal to determine a type of a discontinuity of the communication channel. In other words, the sign or angle of the reflection coefficients can be determined from the phase of the frequency domain correlation results between the reflected signal and the delayed version of the stimulus signal.

According to exemplary embodiments, at each time delay d, where d can range from $d_0$ (e.g., 0 or other delayed value if prior knowledge of the communication channel is known)

to $d_{max}$ (e.g., the predefined maximal round trip time or other time delay value greater than the beginning time delay), the frequency domain correlation can be performed between the frequency domain representation of the reflected signal and frequency domain representations of the time delayed versions of the stimulus signal. From the resulting frequency domain correlation values, a phase vector can be formed, the elements of which are the phase of the frequency domain correlation values. The phase vector can be plotted verses the time delay d (integer multiples of the sampling interval T), over the range of $d_0$ to $d_{max}$. Using the phase vector plot, the sign of the reflection coefficients can be determined. According to exemplary embodiments, the range for a positive reflection coefficient can be from $-\pi/2$ to $\pi/2$, and outside of this range can be for negative reflection coefficients. By adjusting the time delay to match the delay of the communication channel, once the optimal delay is selected, the reflected signal from a positive reflection will be in phase with the stimulus signal, while that from the negative reflection will be 180 degrees out of phase with the stimulus signal.

Thus, according to exemplary embodiments, the analyzer 130 can calculate reflection coefficients for each identified correlation peak using at least the determined locations of the discontinuities of the communication channel, and can determine a topology of the communication channel using the reflection coefficients. The phase information can be used for determining the sign of the reflection coefficients. When the phase information is within a predetermined range, the sign of the reflection coefficient associated with the identified correlation peak is positive. When the phase information is outside the predetermined range, the sign of the reflection coefficient associated with the identified correlation peak is negative. Using this information, the type of the discontinuity can be determined, and, hence, the topology of the communication channel 115.

For example, when an amplitude of an identified correlation peak exceeds a predetermined threshold function for an open/short, and when the sign of the reflection coefficient associated with the identified correlation peak is positive, the type of discontinuity can comprise an open. For example, when an amplitude of an identified correlation peak exceeds a predetermined threshold function for an open/short, and when the sign of the reflection coefficient associated with the identified correlation peak is negative, the type of discontinuity can comprise a short. For example, when an amplitude of a first identified correlation peak is less than a first predetermined threshold function for an open/short and greater than a second predetermined threshold function for a bridge tap, and when the sign of the reflection coefficient associated with the first identified correlation peak is negative, the type of discontinuity can comprise a bridge tap. Thus, the location of the first identified correlation peak can comprise the location of a bridge tap. When an amplitude of a second identified correlation peak is greater than a third predetermined threshold function (e.g., the threshold function for an open-end of a bridge tap can be a reduced version of the threshold function for a normal open due to the previous energy loss), and when the sign of the reflection coefficient associated with the second identified correlation peak is positive, the difference between a location of the second identified correlation peak and the location of the first identified peak can comprise a length of the bridge tap.

According to an alternative exemplary embodiment of the present invention, a stimulus-response system for determining characteristics associated with a communication channel can include a stimulus generator for generating a stimulus signal. The stimulus generator can be, for example, transmitter 105 of FIG. 1. However, the stimulus generator can be any electrical or electronic component or device capable of generating stimulus signals. The stimulus signal can comprise a narrowband stimulus signal. For example, the narrowband stimulus signal can comprise sine packets windowed by a Blackman-Harris function. However, the narrowband stimulus signal can comprise any function or polynomial designed to minimize packet length consistent with a constrained stimulus bandwidth. The narrowband stimulus signal can mitigate effects of dispersion associated with the communication channel. The stimulus-response system can include a receiver for receiving a response signal via the communication channel in response to the narrowband stimulus signal. The receiver can be, for example, receiver 120 of FIG. 1. However, the receiver can be any type of electrical or electronic component or device capable of receiving the response signal via the communication channel in response to the narrowband stimulus signal.

According to exemplary embodiments, the response signal can comprise at least one reflection of the narrowband stimulus signal from at least one discontinuity of the communication channel. According to an exemplary embodiment, the stimulus generator can adaptively determine a packet length of the narrowband stimulus signal based on attenuation associated with the communication channel.

The stimulus-response system can comprise means for generating an estimate of a baseline signal by applying the narrowband stimulus signal to a model of the communication channel. The receiver can mitigate baseline effects to the response signal by subtracting the estimated baseline signal from the response signal. The baseline signal can comprise a near-end echo of the narrowband stimulus signal associated with transmission of the narrowband stimulus signal. The response signal can comprise the near-end echo and reflections of the narrowband stimulus signal by discontinuities of the communication channel.

According to exemplary embodiments, the stimulus-response system can include a correlator for performing frequency domain correlation between a frequency domain representation of the response signal and frequency domain representations of a plurality of time-delayed versions of the narrowband stimulus signal to generate frequency domain correlation information. The correlator can be, for example, correlator 125. However, the correlator can be any type of electrical or electronic component or device that is capable of performing the frequency domain correlation.

According to exemplary embodiments, the stimulus-response system can include an analyzer for identifying correlation peaks in a magnitude of the frequency domain correlation information to determine locations of discontinuities of the communication channel. The analyzer can be, for example, analyzer 130 of FIG. 1. However, the analyzer can be any type of electrical or electronic component or device that is capable of identifying peaks in the magnitude of the frequency domain correlation information. The identified correlation peaks are associated with the locations of the discontinuities of the communication channel. According to exemplary embodiments, the correlator can perform a Fourier transform on the response signal to generate the frequency domain representation of the response signal. The correlator can generate the plurality of time-delayed versions of the narrowband stimulus signal. The correlator can perform Fourier transforms on the plurality of time-delayed versions of the narrowband stimulus signal to generate the frequency domain representations of the plurality of time-delayed versions of the narrowband stimulus signal.

According to exemplary embodiments, the analyzer can examine phase information associated with the frequency domain correlation information of the response signal relative to an associated time-delayed version of the narrowband stimulus signal to determine a type of a discontinuity of the communication channel. Additionally, the analyzer can determine round trip loss of the communication channel to the determined location of the discontinuity using an amplitude of the identified correlation peak and an amplitude of a reference correlation peak. The analyzer can determine path loss of the communication channel to the determined location of the discontinuity using the determined round trip loss and at least one characteristic of a type of the discontinuity.

Figure 5:
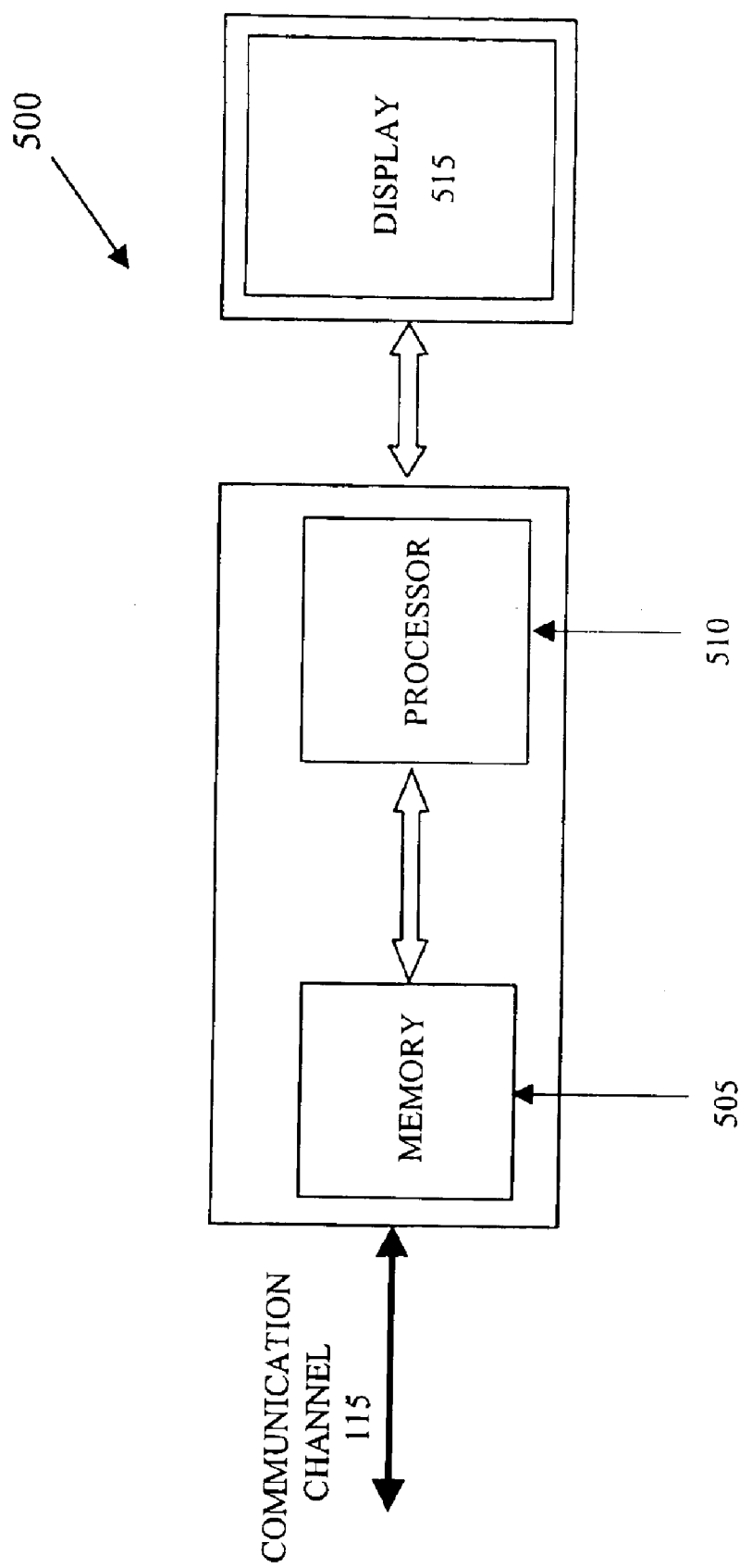
FIG. 5 is a diagram illustrating a system for determining characteristics associated with a communication channel, in accordance with an alternative exemplary embodiment of the present invention.

FIG. 5 is a diagram illustrating a system 500 for determining characteristics associated with a communication channel, in accordance with an alternative exemplary embodiment of the present invention. The system 500 can be embodied in, for example, any type of personal computer (PC), a digital signal processing (DSP) processor or system, an application-specific integrated circuit (ASIC), a programmable read-only memory (PROM), an erasable programmable read-only memory (EPROM), an electrically-erasable programmable read-only memory (EEPROM), or the like. System 500 can include a memory 505. The memory 505 can be any type of computer memory or any other type of electronic storage medium that is located either internally or externally to the system 600, such as, for example, read-only memory (ROM), random access memory (RAM), compact disc read-only memory (CDROM), electro-optical memory, magneto-optical memory, or the like. As will be appreciated based on the following description, the memory 505 can, for example, be programmed using conventional techniques known to those having ordinary skill in the art of computer programming. The actual source code or object code for carrying out the steps of, for example, a computer program can be stored in the memory 505.

The system 500 can also include a processor 510, for example, to execute the computer program stored in the memory 505. The processor 510 can be any known processor, such as, for example, any type of microprocessor. However, those of ordinary skill in the art will recognize that the system 500 can be any combination of hardware, software, and/or firmware. The system 500 can include a connection to a communications channel, such as communications channel 115 of FIG. 1. The connection can be any type of electrical connection capable of communicating electrical information. The system 500 can also include a display device 515. The display device 515 can be any type of computer monitor or video display device capable of displaying graphical and/or textual information. The system 500 can also include other components, such as, for example, a network connection for connecting the system 500 to one or more networks (e.g., intranets or internets) or other systems. The network connection can be any type of network connection, such as, for example, an Ethernet connection, to a remote computer system, network or the like, or any other form of electrical connection over which electrical information can be communicated.

According to exemplary embodiments, the memory 505 can store the steps of a computer program to transmit a first signal via the communication channel, such as communication channel 115 of FIG. 1, and receive a second signal via the communication channel in response to the first signal. The second signal is associated with the first signal. The memory 505 can store the steps of a computer program to perform frequency domain correlation between a frequency domain representation of the second signal and frequency domain representations of a plurality of time-delayed versions of the first signal to generate frequency domain correlation information. The memory 505 can store steps of a computer program to identify correlation peaks in a magnitude of the frequency domain correlation information to determine locations of discontinuities of the communication channel. The identified correlation peaks are associated with the locations of the discontinuities of the communication channel.

The memory 505 can store the steps of a computer program to identify correlation peaks by determining where magnitudes of the frequency domain correlation information exceed at least one predetermined threshold function. The memory 505 can store the steps of a computer program to determine a type of a located discontinuity from among a plurality of types of discontinuities by comparing an amplitude of the identified correlation peak with each of a plurality of predetermined threshold functions. According to exemplary embodiments, each type of discontinuity is associated with one of the plurality of predetermined threshold functions. The memory 505 can store the steps of a computer program to determine round trip loss of the communication channel to the determined location of the discontinuity using an amplitude of the identified correlation peak and an amplitude of a reference correlation peak. The memory 505 can store the steps of a computer program to determine path loss of the communication channel to the determined location of the discontinuity using the determined round trip loss and at least one characteristic of a type of the discontinuity.

According to exemplary embodiments, the first signal can comprise a stimulus signal. For the step of transmitting, the memory 505 can store steps of a computer program to generate the stimulus signal. The second signal can comprise at least one reflection of the stimulus signal from at least one discontinuity of the communication channel. For example, the stimulus signal can comprise a narrowband stimulus signal. The narrowband stimulus signal can mitigate effects of dispersion associated with the communication channel. According to an exemplary embodiment, the narrowband stimulus signal can comprise sine packets windowed by a Blackman-Harris function. However, the narrowband stimulus signal can comprise any function or polynomial designed to minimize packet length consistent with a constrained stimulus bandwidth. The memory 505 can store the steps of a computer program to adaptively determine a packet length of the narrowband stimulus signal based on attenuation associated with the communication channel.

According to exemplary embodiments, the memory 505 can store the steps of a computer program to generate an estimate of a baseline signal by applying the first signal to a model of the communication channel, and mitigate baseline effects to the second signal by subtracting the estimated baseline signal from the second signal. The baseline signal can comprise a near-end echo of the first signal associated with transmission of the first signal. The second signal can comprise both the near-end echo and reflections of the first signal by discontinuities of the communication channel.

According to exemplary embodiments, for the step of performing frequency domain correlation, the memory 505 can store the steps of a computer program to perform a Fourier transform on the second signal to generate the frequency domain representation of the second signal. The memory 505 can store the steps of a computer program to generate the plurality of time-delayed versions of the first signal. The memory 505 can store the steps of a computer program to perform Fourier transforms on the plurality of time-delayed versions of the first signal to generate the frequency domain representations of the plurality of time-delayed versions of the first signal. According to an exemplary embodiment, a time delay of a first of the plurality of time-delayed versions of the first signal can be greater than zero, when at least one attribute of the communication channel is known a priori. The at least one attribute of the communication channel known a priori can comprise, for example, a length of the communication channel in which there is an absence of discontinuities of the communication channel. However, by specifying the start and end time delays of the plurality of time-delayed versions of the first signal (i.e., the time delays of the first and last time-delayed versions of the first signal), discontinuities can be detected within any specified range of distance along the communication channel.

According to exemplary embodiments, the memory 505 can store the steps of a computer program to examine phase information associated with the frequency domain correlation information of the second signal relative to an associated time-delayed version of the first signal to determine a type of a discontinuity of the communication channel. The memory 505 can store the steps of a computer program to calculate reflection coefficients for each identified correlation peak using at least the determined locations of the discontinuities of the communication channel. The memory 505 can store the steps of a computer program to determine a topology of the communication channel using the reflection coefficients. The phase information can be used for determining a sign of the reflection coefficients. According to exemplary embodiments, when the phase information is within a predetermined range, the sign of the reflection coefficient associated with the identified correlation peak is positive. However, when the phase information is outside the predetermined range, the sign of the reflection coefficient associated with the identified correlation peak is negative.

For example, when an amplitude of an identified correlation peak exceeds a predetermined threshold function and when the sign of the reflection coefficient associated with the identified correlation peak is positive, the type of discontinuity can comprise an open. When an amplitude of an identified correlation peak exceeds a predetermined threshold function and when the sign of the reflection coefficient associated with the identified correlation peak is negative, the type of discontinuity can comprise a short. When an amplitude of a first identified correlation peak is less than a first predetermined threshold function and greater than a second predetermined threshold function, and when the sign of the reflection coefficient associated with the first identified correlation peak is negative, the type of discontinuity can comprise a bridge tap. According to exemplary embodiments, the location of the first identified peak can comprise a location of the bridge tap. When an amplitude of a second identified correlation peak is greater than a third predetermined threshold function, and when the sign of the reflection coefficient associated with the second identified correlation peak is positive, the difference between a location of the second identified correlation peak and the location of the first identified peak can comprise a length of the bridge tap.

Figure 6A:
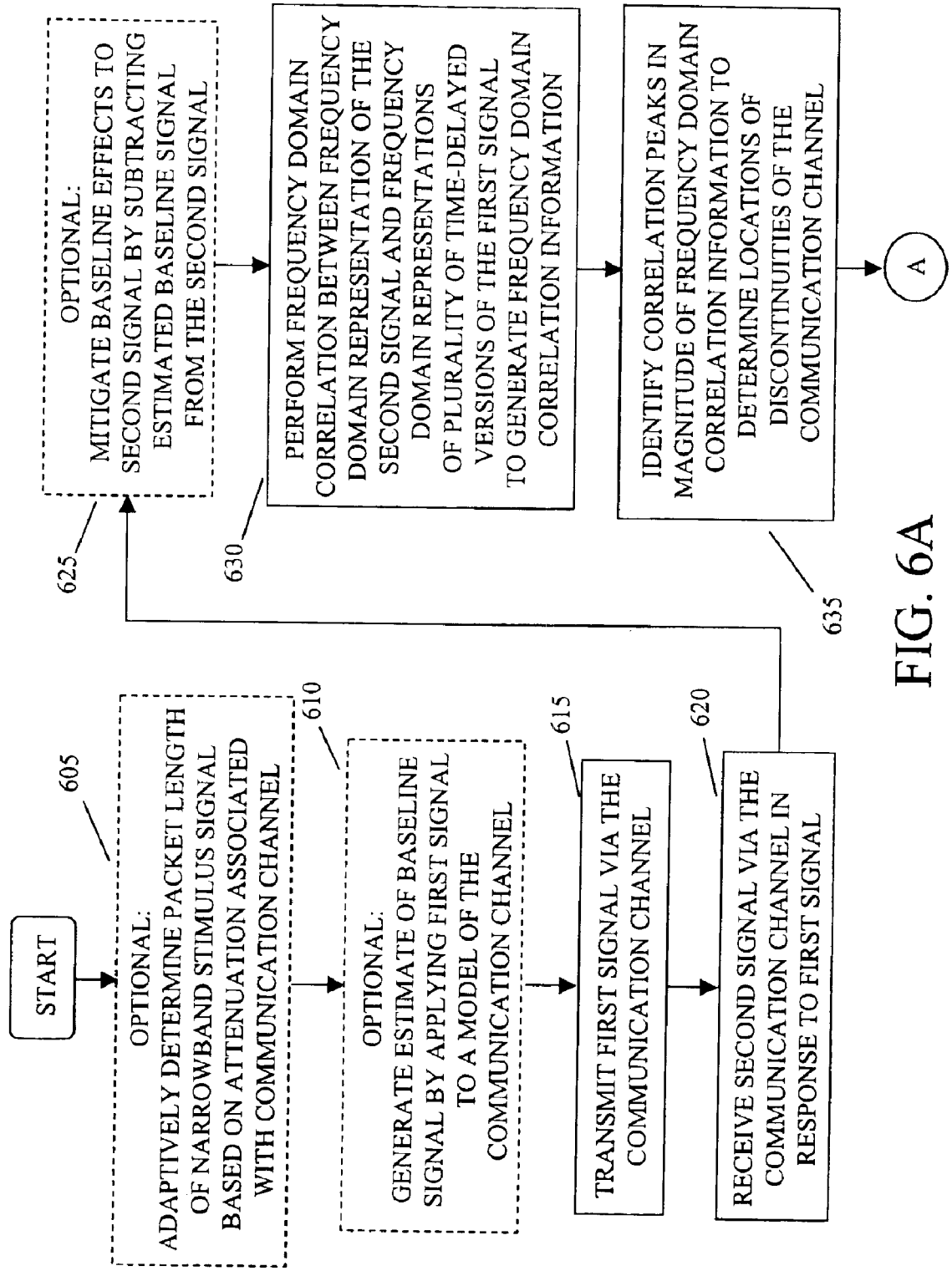
FIGS. 6A and 6B are flowcharts illustrating steps for determining characteristics associated with a communication channel, in accordance with an exemplary embodiment of the present invention.
Figure 6B:
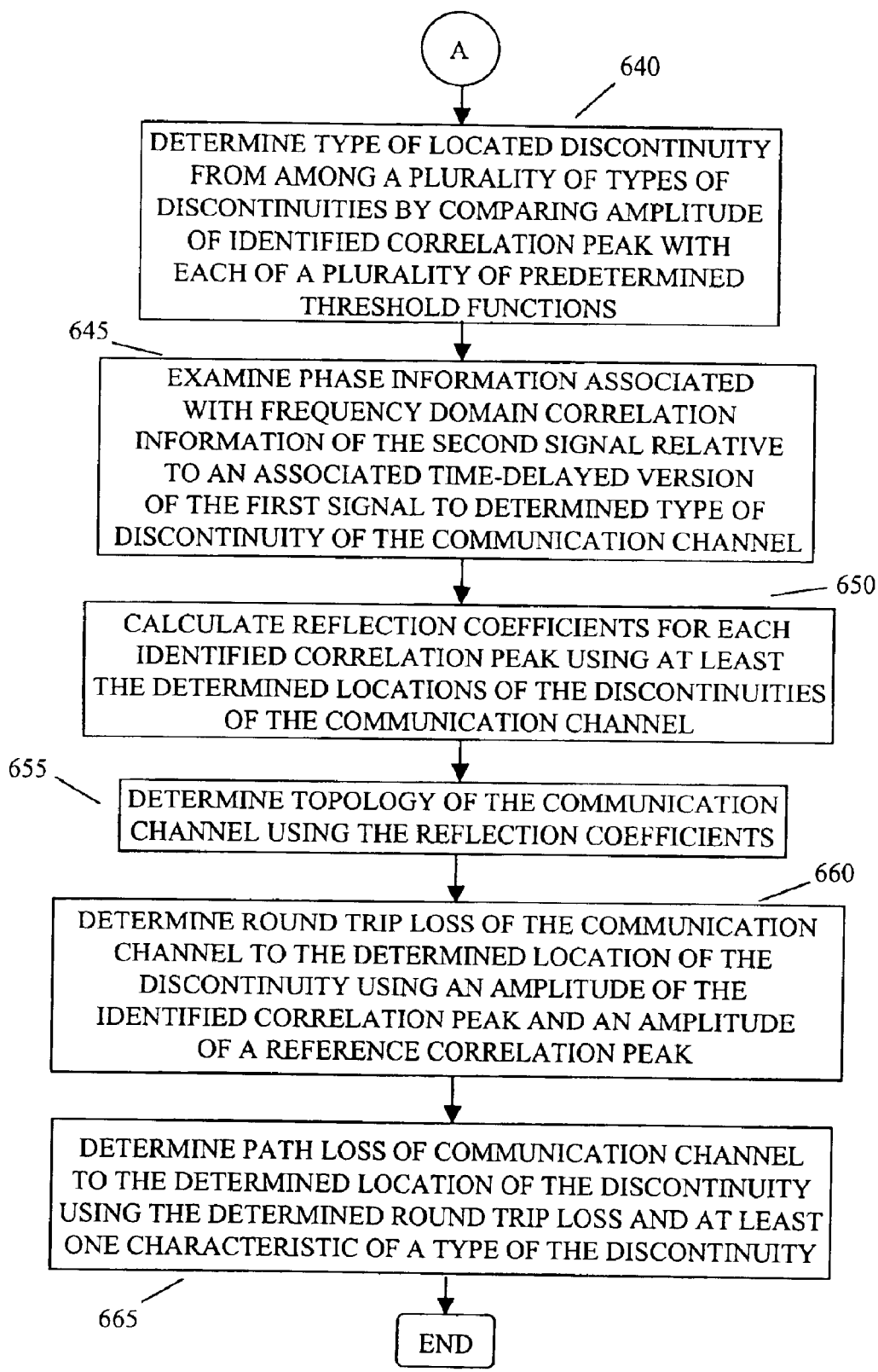

FIGS. 6A and 6B are flowcharts illustrating steps for determining characteristics associated with a communication channel, in accordance with an exemplary embodiment of the present invention. Optionally, in step 605 of FIG. 6A, a packet length of a narrowband stimulus signal can be adaptively determined based on attenuation associated with the communication channel. Optionally, in step 610, an estimate of a baseline signal can be generated by applying the first signal to a model of the communication channel. In step 615, a first signal can be transmitted via the communication channel. In step 620, a second signal can be received via the communication channel in response to the first signal. The second signal is associated with the first signal. In accordance with exemplary embodiments, the first signal can comprise a stimulus signal. According to an exemplary embodiment, for the step 615, the step of transmitting can comprise the step of generating the stimulus signal. The second signal can comprise at least one reflection of the stimulus signal from at least one discontinuity of the communication channel. According to an exemplary embodiment, the stimulus signal can comprise a narrowband stimulus signal. The narrowband stimulus signal can mitigate effects of dispersion associated with the communication channel. For example, the narrowband stimulus signal can comprise sine packets windowed by a Blackman-Harris function. However, the narrowband stimulus signal can comprise any function or polynomial designed to minimize packet length consistent with a constrained stimulus bandwidth.

Optionally, in step 625, baseline effects to the second signal can be mitigated by subtracting the estimated baseline signal from the second signal. According to exemplary embodiments, the baseline signal can comprise a near-end echo of the first signal associated with transmission of the first signal. The second signal can comprise both the near-end echo and reflections of the first signal by discontinuities of the communication channel. In step 630, frequency domain correlation can be performed between a frequency domain representation of the second signal and frequency domain representations of a plurality of time-delayed versions of the first signal to generate frequency domain correlation information.

Figure 7:
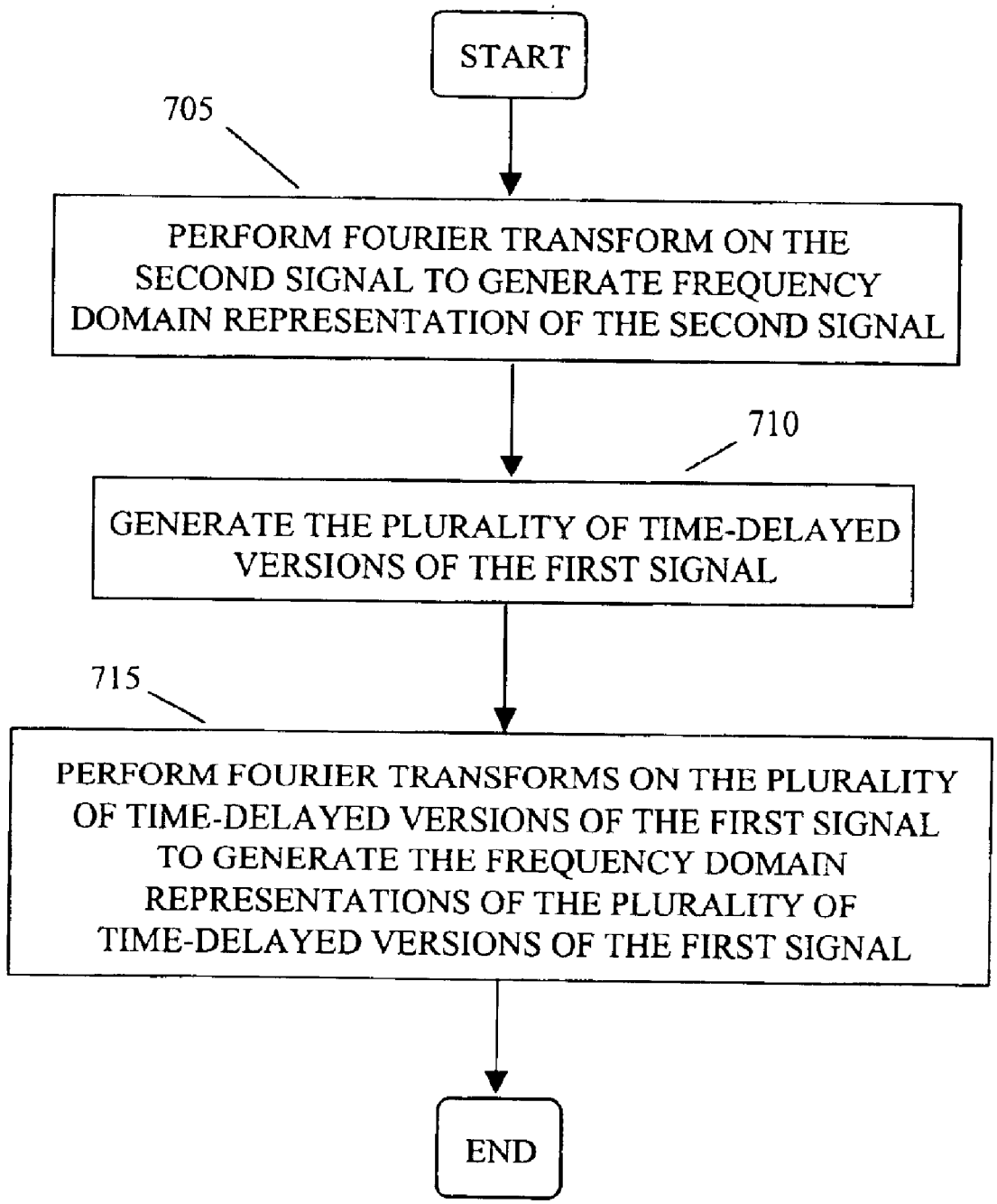
FIG. 7 is a flowchart illustrating steps for performing frequency domain correlation, in accordance with an exemplary embodiment of the present invention.

FIG. 7 is a flowchart illustrating steps for the step 630 of performing frequency domain correlation, in accordance with an exemplary embodiment of the present invention. In step 705 of FIG. 7, a Fourier transform can be performed on the second signal to generate the frequency domain representation of the second signal. In step 710, the plurality of time-delayed versions of the first signal can be generated. In step 715, Fourier transforms can be performed on the plurality of time-delayed versions of the first signal to generate the frequency domain representations of the plurality of time-delayed versions of the first signal. According to an exemplary embodiment, a time delay of a first of the plurality of time-delayed versions of the first signal is greater than zero, when at least one attribute of the communication channel is known a priori. The at least one attribute of the communication channel known a priori can comprise, for example, a length of the communication channel in which there is an absence of discontinuities of the communication channel. However, by specifying the start and end time delays of the plurality of time-delayed versions of the first signal (i.e., the time delays of the first and last time-delayed versions of the first signal), discontinuities can be detected within any specified range of distance along the communication channel.

Figure 8:
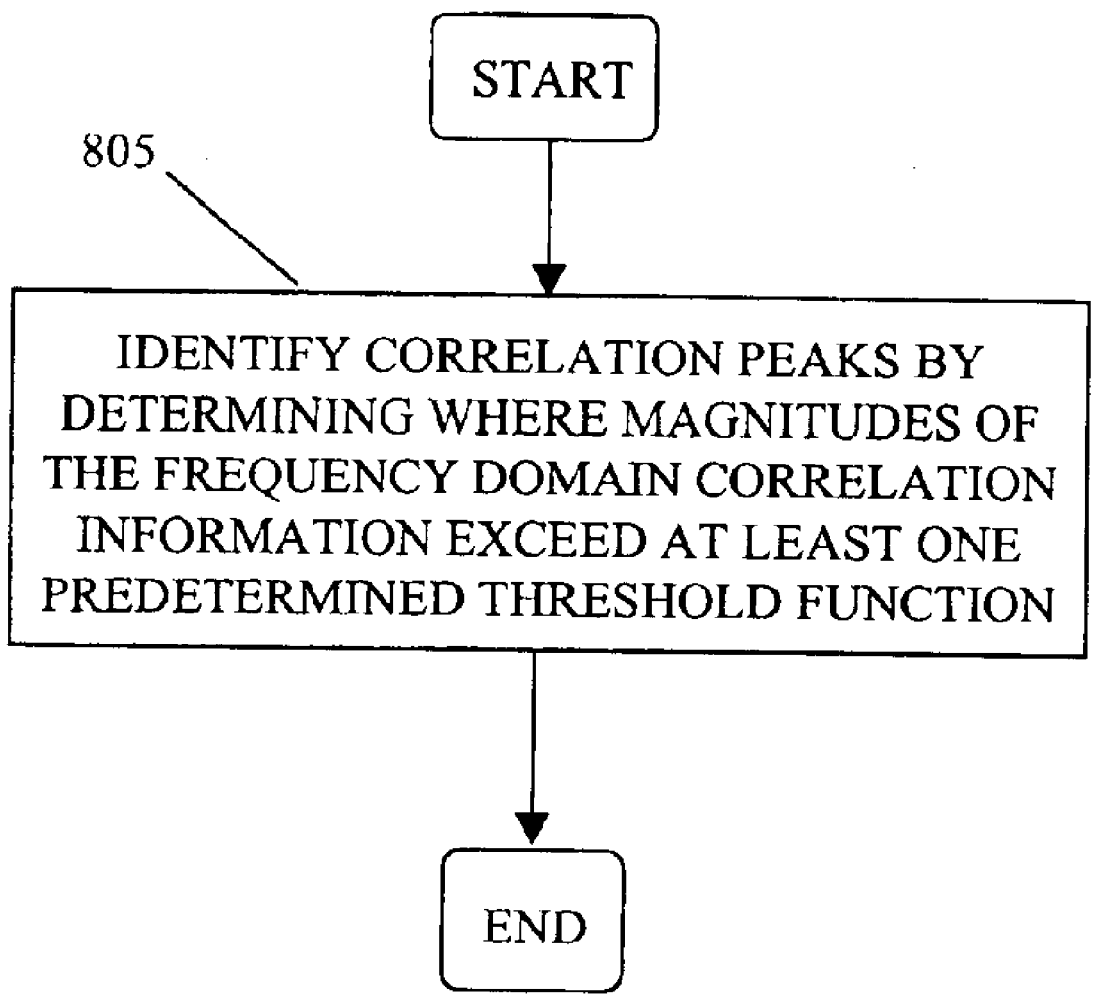
FIG. 8 is a flowchart illustrating steps for identifying correlation peaks, in accordance with an exemplary embodiment of the present invention.

In FIG. 6A, in step 635, correlation peaks can be identified in a magnitude of the frequency domain correlation information to determine locations of discontinuities of the communication channel. The identified correlation peaks can be associated with the locations of the discontinuities of the communication channel. FIG. 8 is a flowchart illustrating steps for the step 635 of identifying correlation peaks, in accordance with an exemplary embodiment of the present invention. In step 805 of FIG. 8, correlation peaks can be identified by determining where magnitudes of the frequency domain correlation information exceed at least one predetermined threshold function.

In step 640 of FIG. 6B, a type of a located discontinuity can be determined from among a plurality of types of discontinuities by comparing an amplitude of the identified correlation peak with each of a plurality of predetermined threshold functions. According to exemplary embodiments, each type of discontinuity can be associated with one of the plurality of predetermined threshold functions. In step 645, phase information associated with the frequency domain correlation information of the second signal can be examined relative to an associated time-delayed version of the first signal to determine a type of a discontinuity of the communication channel. In step 650, reflection coefficients can be calculated for each identified correlation peak using at least the determined locations of the discontinuities of the communication channel. In step 655, a topology of the communication channel can be determined using the reflection coefficients. According to exemplary embodiments, the phase information can be used for determining a sign of the reflection coefficients.

For example, when the phase information is within a predetermined range, the sign of the reflection coefficient associated with the identified correlation peak is positive. When the phase information is outside the predetermined range, the sign of the reflection coefficient associated with the identified correlation peak is negative. For example, when an amplitude of an identified correlation peak exceeds a predetermined threshold function and when the sign of the reflection coefficient associated with the identified correlation peak is positive, the type of discontinuity can comprise an open. When an amplitude of an identified correlation peak exceeds a predetermined threshold function and when the sign of the reflection coefficient associated with the identified correlation peak is negative, the type of discontinuity can comprise a short. When an amplitude of a first identified correlation peak is less than a first predetermined threshold function and greater than a second predetermined threshold function, and when the sign of the reflection coefficient associated with the first identified correlation peak is negative, the type of discontinuity can comprise a bridge tap. According to exemplary embodiments, the location of the first identified peak can comprise a location of the bridge tap. When an amplitude of a second identified correlation peak is greater than a third predetermined threshold function, and when the sign of the reflection coefficient associated with the second identified correlation peak is positive, a difference between a location of the second identified correlation peak and the location of the first identified peak can comprise a length of the bridge tap.

In step 660, round trip loss of the communication channel to the determined location of the discontinuity can be determined using an amplitude of the identified correlation peak and an amplitude of a reference correlation peak. In step 665, path loss of the communication channel to the determined location of the discontinuity can be determined using the determined round trip loss and at least one characteristic of a type of the discontinuity.

Figure 9:
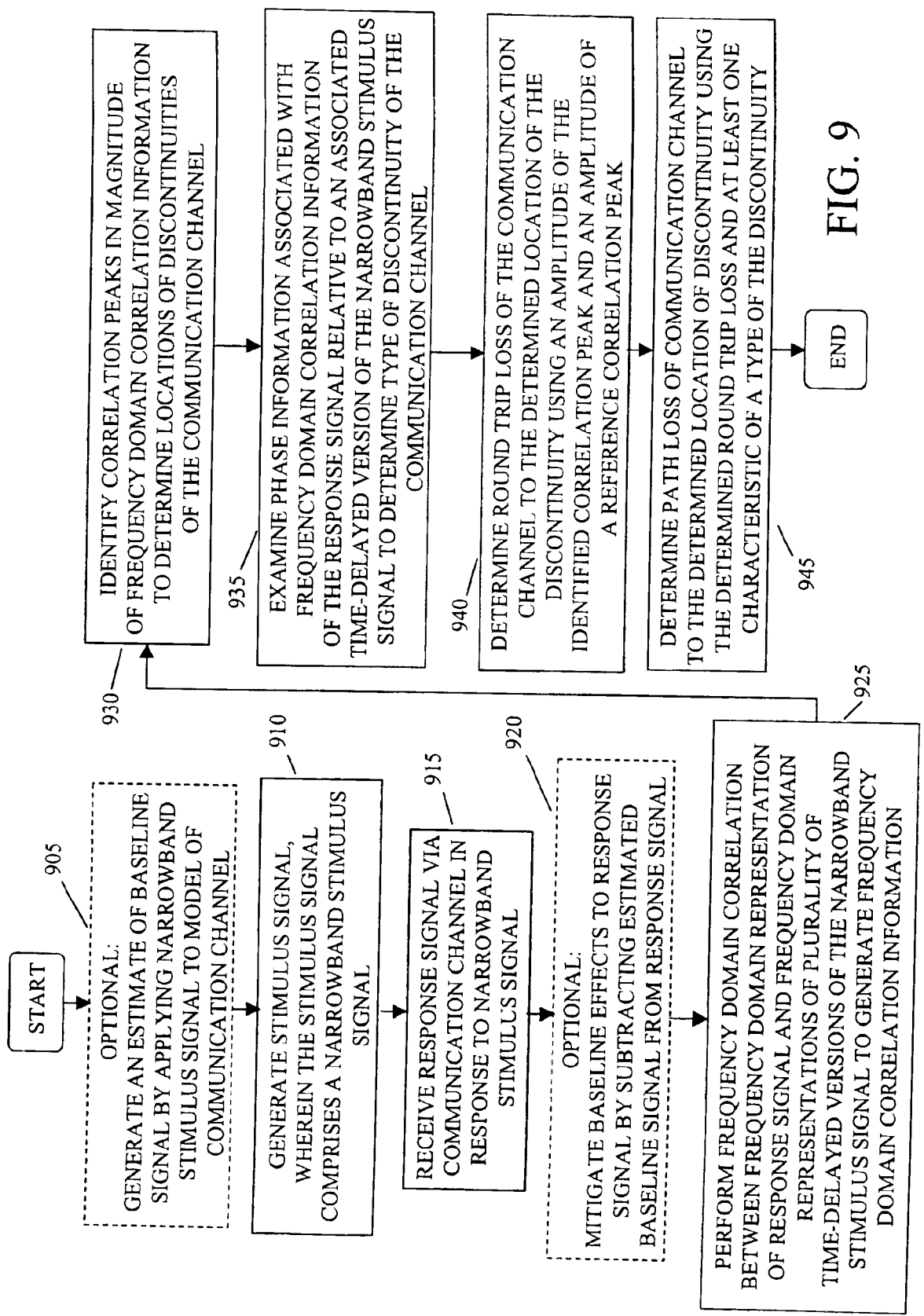
FIG. 9 is a flowchart illustrating steps for stimulus-response method for determining characteristics associated with a communication channel, in accordance with an exemplary embodiment of the present invention.

FIG. 9 is a flowchart illustrating steps for stimulus-response method for determining characteristics associated with a communication channel, in accordance with an exemplary embodiment of the present invention. Optionally, in step 905, an estimate of a baseline signal can be generated by applying the narrowband stimulus signal to a model of the communication channel. According to exemplary embodiments, the baseline signal can comprise a near-end echo of the narrowband stimulus signal associated with transmission of the narrowband stimulus signal. The response signal can comprise both the near-end echo and reflections of the narrowband stimulus signal by discontinuities of the communication channel. In step 910, a stimulus signal can be generated. According to exemplary embodiments, the stimulus signal can comprise a narrowband stimulus signal. The narrowband stimulus signal can mitigate effects of dispersion associated with the communication channel. For example, the narrowband stimulus signal can comprise sine packets windowed by a Blackman-Harris function. However, the narrowband stimulus signal can comprise any function or polynomial designed to minimize packet length consistent with a constrained stimulus bandwidth.

Figure 10:
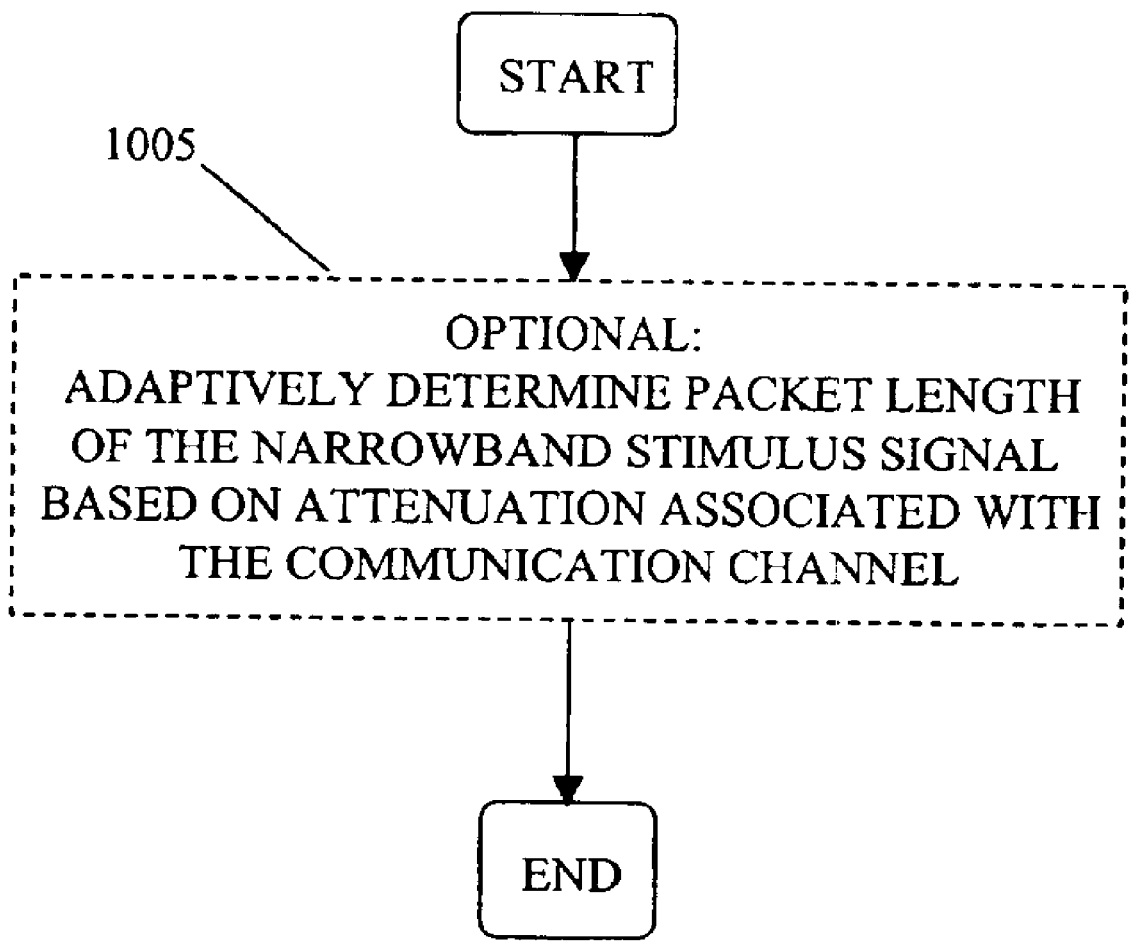
FIG. 10 is a flowchart illustrating steps for generating a stimulus signal, in accordance with an exemplary embodiment of the present invention.

FIG. 10 is a flowchart illustrating steps for the step 910 of generating a stimulus signal, in accordance with an exemplary embodiment of the present invention. In step 1005 of FIG. 10, a packet length of the narrowband stimulus signal can be adaptively determined based on attenuation associated with the communication channel.

In step 915 of FIG. 9, a response signal can be received via the communication channel in response to the narrowband stimulus signal. The response signal can comprise at least one reflection of the narrowband stimulus signal from at least one discontinuity of the communication channel. Optionally, in step 920, baseline effects to the response signal can be mitigated by subtracting the estimated baseline signal from the response signal. In step 925, frequency domain correlation can be performed between a frequency domain representation of the response signal and frequency domain representations of a plurality of time-delayed versions of the narrowband stimulus signal to generate frequency domain correlation information.

Figure 11:
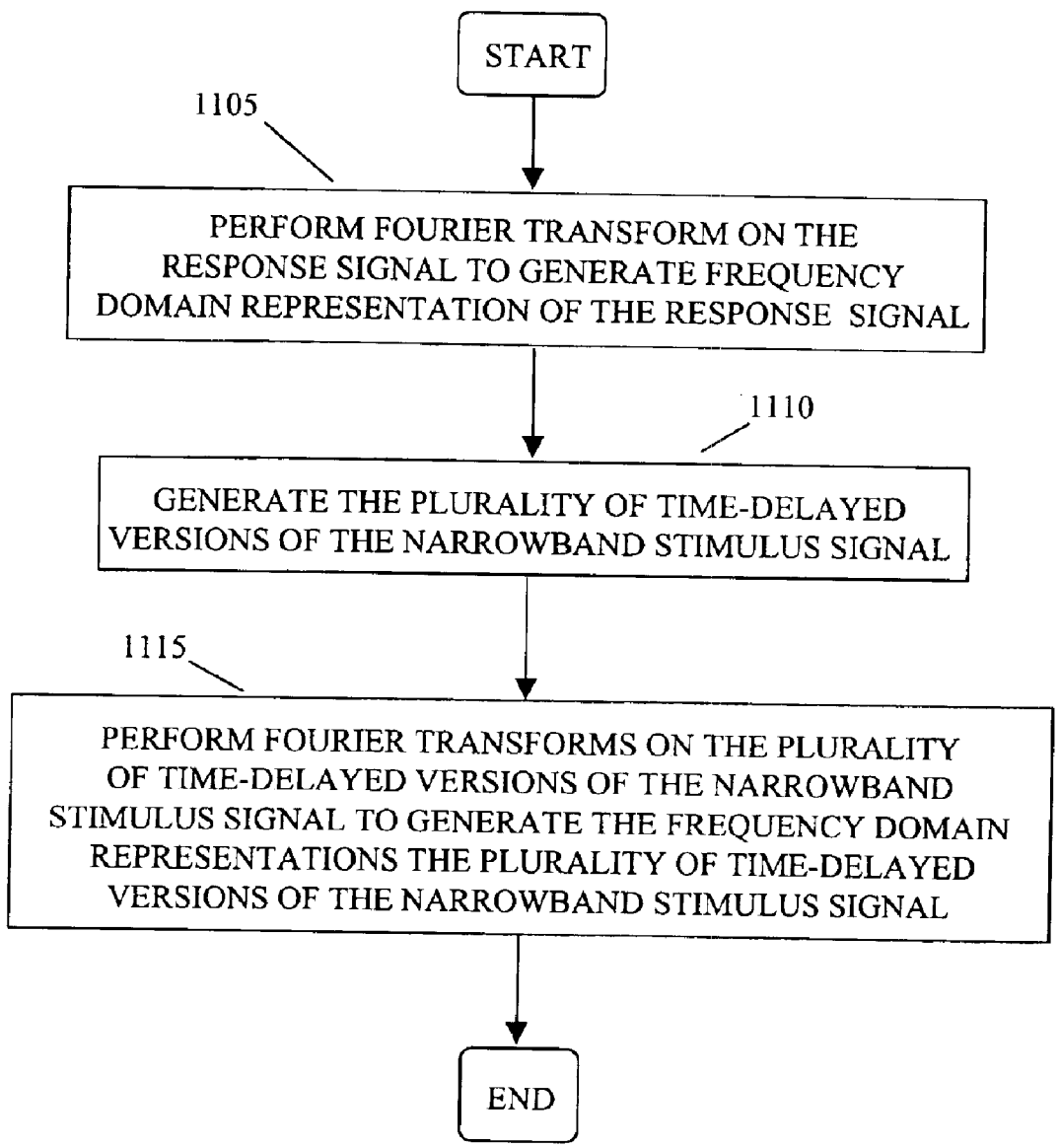
FIG. 11 is a flowchart illustrating steps for performing frequency domain correlation, in accordance with an exemplary embodiment of the present invention.

FIG. 11 is a flowchart illustrating steps for the step 925 of performing frequency domain correlation, in accordance with an exemplary embodiment of the present invention. In step 1105, a Fourier transform can be performed on the response signal to generate the frequency domain representation of the response signal. In step 1110, the plurality of time-delayed versions of the narrowband stimulus signal can be generated. In step 1115, Fourier transforms can be performed on the plurality of time-delayed versions of the narrowband stimulus signal to generate the frequency domain representations of the plurality of time-delayed versions of the narrowband stimulus signal.

In step 930 of FIG. 9, correlation peaks can be identified in a magnitude of the frequency domain correlation information to determine locations of discontinuities of the communication channel. The identified correlation peaks are associated with the locations of the discontinuities of the communication channel. In step 935, phase information associated with the frequency domain correlation information of the response signal can be examined relative to an associated time-delayed version of the narrowband stimulus signal to determine a type of a discontinuity of the communication channel. In step 940, round trip loss of the communication channel to the determined location of the discontinuity can be determined using an amplitude of the identified correlation peak and an amplitude of a reference correlation peak. In step 945, path loss of the communication channel to the determined location of the discontinuity can be determined using the determined round trip loss and at least one characteristic of a type of the discontinuity.

The steps of a computer program as illustrated in FIGS. 6A, 6B, and 7–11 for determining characteristics associated with a communication channel can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

Exemplary embodiments of the present invention can be used in, or in conjunction with, for example, communications testing equipment for testing communication channels, such as, for example, transmission lines for communicating xDSL signals. Exemplary embodiments of the present invention can be embodied, in whole or in part, in hardware, firmware, any other type of electronic circuitry, software, or any combination thereof.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A system for determining characteristics associated with a communication channel, comprising:
    a transmitter for transmitting a first signal via the communication channel;
    a receiver for receiving a second signal via the communication channel in response to the first signal,
        wherein the second signal is associated with the first signal;
    a correlator for performing frequency domain correlation between a frequency domain representation of the second signal and frequency domain representations of a plurality of time-delayed versions of the first signal to generate frequency domain correlation information; and
    an analyzer for identifying correlation peaks in a magnitude of the frequency domain correlation information to determine locations of discontinuities of the communication channel,
        wherein identified correlation peaks are associated with the locations of the discontinuities of the communication channel.

2. The system of claim 1, wherein the analyzer identifies correlation peaks by determining where magnitudes of the frequency domain correlation information exceed at least one predetermined threshold function.

3. The system of claim 1, wherein the analyzer determines a type of a located discontinuity from among a plurality of types of discontinuities by comparing an amplitude of the identified correlation peak with each of a plurality of predetermined threshold functions,
    wherein each type of discontinuity is associated with one of the plurality of predetermined threshold functions.

4. The system of claim 1, wherein the communication channel comprises a transmission line.

5. The system of claim 1, wherein the first signal comprises a stimulus signal, and wherein the transmitter comprises:
    a stimulus generator for generating the stimulus signal,
        wherein the second signal comprises at least one reflection of the stimulus signal from at least one discontinuity of the communication channel.

6. The system of claim 5, wherein the stimulus signal comprises a narrowband stimulus signal, and
    wherein the narrowband stimulus signal mitigates effects of dispersion associated with the communication channel.

7. The system of claim 6, wherein the stimulus generator adaptively determines a packet length of the narrowband stimulus signal based on attenuation associated with the communication channel.

8. The system of claim 6, wherein the narrowband stimulus signal comprises sine packets windowed by a Blackman-Harris function.

9. The system of claim 1, comprising:
    means for generating an estimate of a baseline signal by applying the first signal to a model of the communication channel,
        wherein the receiver mitigates baseline effects to the second signal by subtracting the estimated baseline signal from the second signal.

10. The system of claim 9, wherein the baseline signal comprises a near-end echo of the first signal associated with transmission of the first signal, and
    wherein the second signal comprises the near-end echo and reflections of the first signal by discontinuities of the communication channel.

11. The system of claim 1, wherein the correlator performs a Fourier transform on the second signal to generate the frequency domain representation of the second signal,
    wherein the correlator generates the plurality of time-delayed versions of the first signal, and
    wherein the correlator performs Fourier transforms on the plurality of time-delayed versions of the first signal to generate the frequency domain representations of the plurality of time-delayed versions of the first signal.

12. The system of claim 11, wherein when at least one attribute of the communication channel is known a priori, a time delay of a first of the plurality of time-delayed versions of the first signal is greater than zero.

13. The system of claim 12, wherein the at least one attribute of the communication channel known a priori comprises a length of the communication channel in which there is an absence of discontinuities of the communication channel.

14. The system of claim 1, wherein a discontinuity of the communication channel comprises one of an open connection in the communication channel, a short in the communication channel, a bridge tap of the communication channel, a change in characteristic impedance of the communication channel, and a discrete lump component,
    wherein the discrete lump component includes at least one of a resistor, a capacitor and an inductor.

15. The system of claim 1, wherein the analyzer examines phase information associated with the frequency domain correlation information of the second signal relative to an associated time-delayed version of the first signal to determine a type of a discontinuity of the communication channel.

16. The system of claim 15, wherein the analyzer calculates reflection coefficients for each identified correlation peak using at least the determined locations of the discontinuities of the communication channel, and determines a topology of the communication channel using the reflection coefficients, wherein the phase information is used for determining a sign of the reflection coefficients.

17. The system of claim 16, wherein when the phase information is within a predetermined range, a sign of a reflection coefficient associated with the identified correlation peak is positive, and wherein when the phase information is outside the predetermined range, the sign of the reflection coefficient associated with the identified correlation peak is negative.

18. The system of claim 17, wherein when an amplitude of an identified correlation peak exceeds a predetermined threshold function and when the sign of the reflection coefficient associated with the identified correlation peak is positive, the type of discontinuity comprises an open.

19. The system of claim 17, wherein when an amplitude of an identified correlation peak exceeds a predetermined threshold function and when the sign of the reflection coefficient associated with the identified correlation peak is negative, the type of discontinuity comprises a short.

20. The system of claim 17, wherein when an amplitude of a first identified correlation peak is less than a first predetermined threshold function and greater than a second predetermined threshold function, and when the sign of the reflection coefficient associated with the first identified correlation peak is negative, the type of discontinuity comprises a bridge tap.

21. The system of claim 20, wherein a location of the first identified peak comprises a location of the bridge tap, and wherein when an amplitude of a second identified correlation peak is greater than a third predetermined threshold function, and when the sign of the reflection coefficient associated with the second identified correlation peak is positive, a difference between a location of the second identified correlation peak and the location of the first identified peak comprises a length of the bridge tap.

22. The system of claim 1, wherein the analyzer determines round trip loss of the communication channel to the determined location of the discontinuity using an amplitude of the identified correlation peak and an amplitude of a reference correlation peak.

23. The system of claim 22, wherein the analyzer determines path loss of the communication channel to the determined location of the discontinuity using the determined round trip loss and at least one characteristic of a type of the discontinuity.

24. A method of determining characteristics associated with a communication channel, comprising the steps of:

transmitting a first signal via the communication channel;

receiving a second signal via the communication channel in response to the first signal,
wherein the second signal is associated with the first signal;

performing frequency domain correlation between a frequency domain representation of the second signal and frequency domain representations of a plurality of time-delayed versions of the first signal to generate frequency domain correlation information; and identifying correlation peaks in a magnitude of the frequency domain correlation information to determine locations of discontinuities of the communication channel,
wherein identified correlation peaks are associated with the locations of the discontinuities of the communication channel.

* * * * *